(12) United States Patent
Lu et al.

(10) Patent No.: US 8,049,521 B2
(45) Date of Patent: Nov. 1, 2011

(54) SOLAR PARAMETRIC TESTING MODULE AND PROCESSES

(75) Inventors: Danny Cam Toan Lu, San Francisco, CA (US); Michel Marriott, Morgan Hill, CA (US); Vicky Svidenko, Sunnyvale, CA (US); Dapeng Wang, Santa Clara, CA (US); Michel R. Frei, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 295 days.

(21) Appl. No.: 12/409,732

(22) Filed: Mar. 24, 2009

(65) Prior Publication Data

US 2009/0256581 A1 Oct. 15, 2009

Related U.S. Application Data

(60) Provisional application No. 61/044,852, filed on Apr. 14, 2008.

(51) Int. Cl.
*G01R 27/08* (2006.01)
*H01L 31/042* (2006.01)

(52) U.S. Cl. .................................. 324/691; 136/250
(58) Field of Classification Search ................. None
See application file for complete search history.

(56) References Cited

U.S. PATENT DOCUMENTS

| | | | |
|---|---|---|---|
| 4,144,493 A | 3/1979 | Lee et al. | |
| 4,628,144 A | 12/1986 | Burger | |
| 4,667,058 A | 5/1987 | Catalano et al. | |
| 4,892,592 A | 1/1990 | Dickson et al. | |
| 5,956,572 A | 9/1999 | Kidoguchi et al. | |
| 6,077,722 A | 6/2000 | Jansen et al. | |
| 6,265,242 B1 | 7/2001 | Komori et al. | |
| 6,281,696 B1 | 8/2001 | Voogel | |
| 6,468,828 B1 | 10/2002 | Glatfelter et al. | |
| 6,841,728 B2 | 1/2005 | Jones et al. | |
| 7,259,321 B2 | 8/2007 | Oswald et al. | |
| 7,671,620 B2 * | 3/2010 | Manz | 324/761.01 |
| 2002/0153037 A1 | 10/2002 | Fischer | |

(Continued)

FOREIGN PATENT DOCUMENTS

| | | |
|---|---|---|
| JP | 2004-241449 | 8/2004 |
| WO | WO-03061013 | 7/2003 |

OTHER PUBLICATIONS

Brecl et al article, "A Detailed Study of Monolithic Contacts and Electrical Losses in a Large-Area Thin-Film Module," Mar. 10, 2005, Progress in Photovoltaics: Research and Applications, 2005, vol. 13, pp. 297-310.

(Continued)

*Primary Examiner* — Jermele M Hollington
(74) *Attorney, Agent, or Firm* — Patterson & Sheridan, L.L.P.

(57) ABSTRACT

Embodiments of the present invention generally relate to a module that can test and analyze various regions of a solar cell device in an automated or manual fashion after one or more steps have been completed in the solar cell formation process. The module used to perform the automated testing and analysis processes can also be adapted to test a partially formed solar cell at various stages of the solar cell formation process within an automated solar cell production line. The automated solar cell production line is generally an arrangement of automated processing modules and automation equipment that is used to form solar cell devices.

15 Claims, 21 Drawing Sheets

U.S. PATENT DOCUMENTS

| | | | |
|---|---|---|---|
| 2005/0252545 A1 | 11/2005 | Nowlan et al. | |
| 2006/0103371 A1 | 5/2006 | Manz | |
| 2009/0188102 A1* | 7/2009 | Lu et al. | 29/527.1 |
| 2009/0287446 A1* | 11/2009 | Wang et al. | 324/96 |
| 2010/0073011 A1* | 3/2010 | Svidenko et al. | 324/537 |
| 2011/0140726 A1* | 6/2011 | Sullivan et al. | 324/756.01 |

OTHER PUBLICATIONS

Compaan et al article, "Optimization of Laser Scribing for Thin-Film PV Modules," Jun. 1998, Final Technical Progress Report (Dec. 4, 1995-Nov. 10, 1997).

PCT International Search Report and Written Opinion dated Dec. 2, 2008 for International Application No. PCT/US2008/78165. (APPM/011927 PCT P).

PCT International Search Report and Written Opinion dated Dec. 22, 2008 for International Application No. PCT/US2008/79585. (APPM/011927 PCT 02).

PCT International Search Report and Written Opinion dated Sep. 30, 2009 for International Application No. PCT/US2009/038063. (APPM/013322 PCT P).

\* cited by examiner

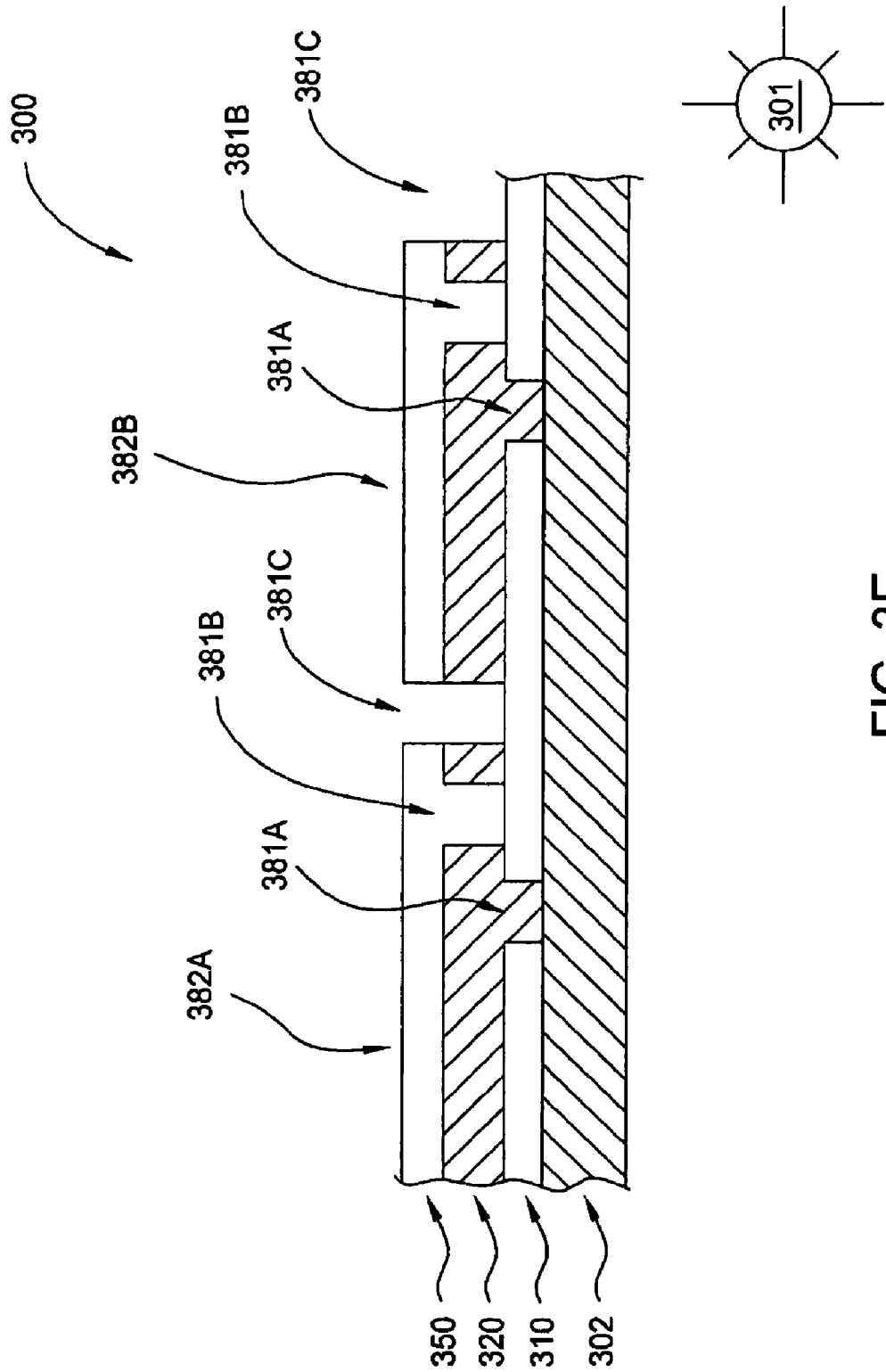

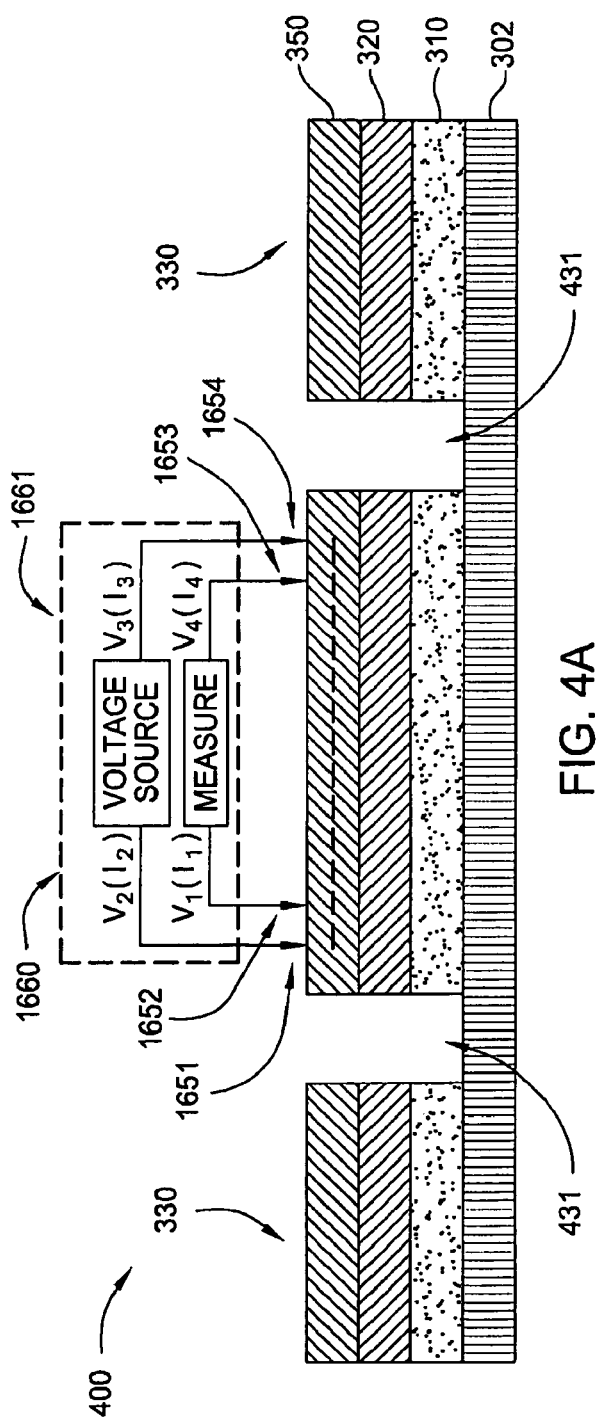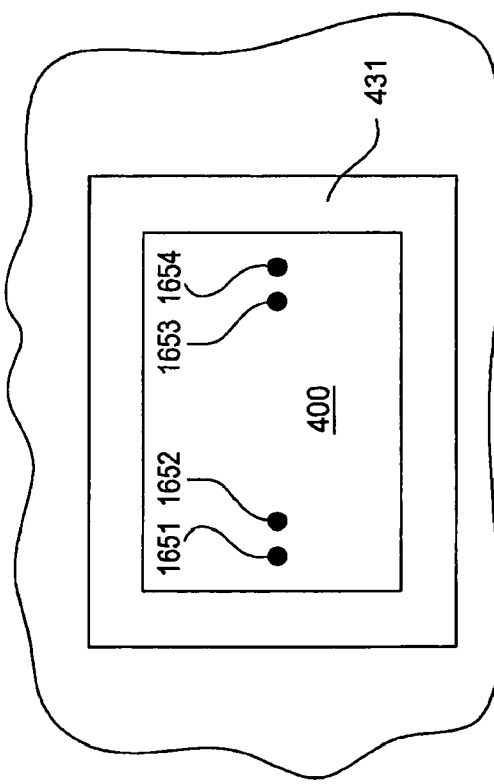
FIG. 4A
FIG. 4B

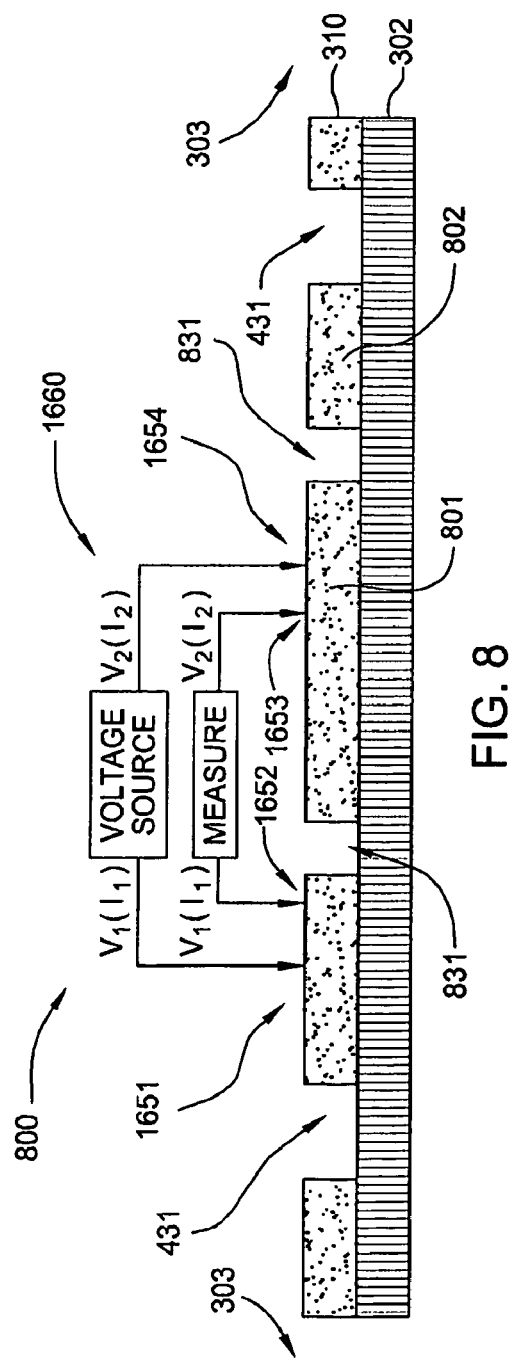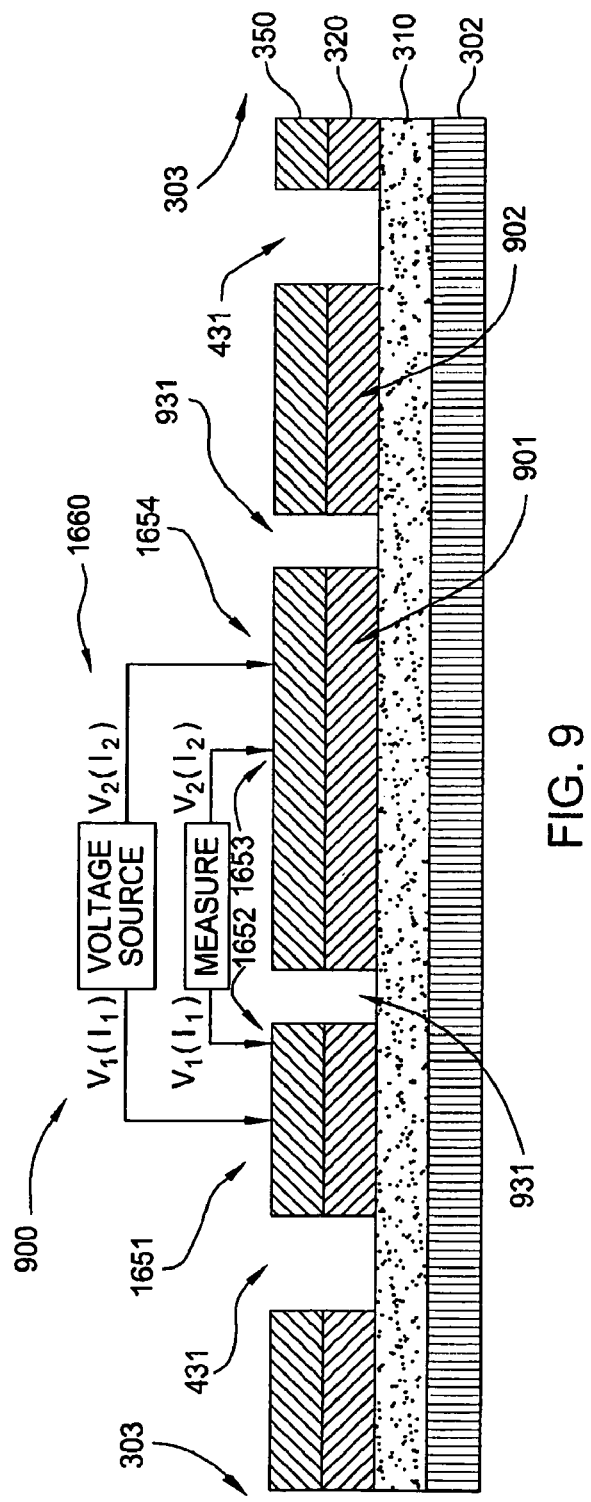

SOLAR PARAMETRIC TESTING MODULE AND PROCESSES

CROSS-REFERENCE TO RELATED APPLICATIONS

This application claims benefit of U.S. provisional patent application Ser. No. 61/044,852, filed Apr. 14, 2008, which is herein incorporated by reference.

This application is related to U.S. application Ser. No. 12/202,199, filed Aug. 29, 2008 and U.S. application Ser. No. 12/201,840, filed Aug. 29, 2008.

BACKGROUND OF THE INVENTION

1. Field of the Invention

Embodiments of the present invention generally relate to apparatus and processes for testing and analyzing the properties of a solar cell device at various stages of formation.

2. Description of the Related Art

Photovoltaic (PV) devices or solar cells are devices which convert sunlight into direct current (DC) electrical power. Typical thin film type PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a backside electrode. The photoelectric conversion unit includes a p-type silicon layer, an n-type silicon layer, and an intrinsic type (i-type) silicon layer sandwiched between the p-type and n-type silicon layers. Several types of silicon films, including microcrystalline silicon film (μc-Si), amorphous silicon film (a-Si), polycrystalline silicon film (poly-Si), and the like, may be utilized to form the p-type, n-type, and/or i-type layers of the photoelectric conversion unit. The backside electrode may contain one or more conductive layers. There is a need for an improved process of forming a solar cell that has good interfacial contact, low contact resistance, and high overall performance.

With traditional energy source prices on the rise, there is a need for a low cost way of producing electricity using a low cost solar cell device. Conventional solar cell manufacturing processes are highly labor intensive and have numerous interruptions that can affect production line throughput, solar cell cost, and device yield. Conventional solar cell fabrication processes also include a number of manual operations that can cause the formed solar cell device properties to vary from one device to another. Thus, there is a need for a continuous non-interrupted flow of solar cell substrates through a solar cell production line to reduce cost and improve device yield.

Additionally, there is a need for an apparatus and method of testing a solar device during different phases of the formation process to assure that the solar cells are formed in a repeatable manner. Also, there is need for a manual or automated testing module that can characterize the properties of a partially formed solar cell device to assure that its performance is within a desired performance range and that the combination of solar cell formation steps create a solar cell device that meets the functional and performance specifications required by the solar cell device manufacturer.

SUMMARY OF THE INVENTION

In one embodiment of the present invention, a solar parametric testing module comprises an automation system having a conveyor configured to receive a solar cell substrate having one or more test structures formed thereon into the solar parametric testing module and transfer the solar cell substrate out of the solar parametric testing module, a vision system having one or more cameras, and a measurement module configured to supply a voltage to a plurality of points on the one or more test structures and measure the resistance between the points. In one embodiment, the vision system is configured to scan the solar cell substrate and send signals regarding the position of one or more features on the solar cell substrate to a system controller. In one embodiment, the automation system is further configured to receive commands from the system controller and position the solar cell substrate based on the signals sent by the vision system.

In another embodiment, a solar parametric testing module comprises an automation system having a conveyor configured to receive a solar cell substrate having one or more test structures formed thereon into the solar parametric testing module and transfer the solar cell substrate out of the solar parametric testing module, a vision system having one or more cameras, a measurement module configured to supply a voltage to a plurality of points on the one or more test structures and measure the resistance between the points, a light source configured to project a controlled amount of light toward a surface of the one or more test structures on a side opposite the measurement module, and an efficiency module coupled to the resistance measurement module and the light source and configured to characterize the performance of the one or more test structures via the light source and the measurement module. In one embodiment, the vision system is configured to scan the solar cell substrate and send signals regarding the position of one or more features on the solar cell substrate to a system controller. In one embodiment, the automation system is further configured to receive commands from the system controller and position the solar cell substrate based on the signals sent by the vision system.

In yet another embodiment of the present invention, a method of characterizing electrical characteristics of a solar cell comprises receiving a solar cell substrate having one or more test structures formed thereon onto an automation system of a solar parametric testing module, sensing the position of the solar cell substrate on the automation system, horizontally positioning the solar cell substrate with respect to at least one edge of the solar cell substrate, locating at least one feature of the solar cell substrate via a vision system comprising at least one camera, sending a signal from the vision system to a system controller, grasping the solar cell substrate with a gripping element and refining the position of the solar cell substrate based on the signal sent by the vision system, contacting the one or more test structures of the solar cell substrate with a plurality of probe pins, measuring electrical characteristics of the one or more test structures via a measurement module coupled to the probe pins, and transferring the solar cell substrate out of the solar parametric testing module.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3E is a side cross-sectional view of a thin film solar cell device according to one embodiment described herein.

FIG. 4A is a schematic cross-sectional diagram of a resistance test structure that can be formed on a solar cell substrate according to one embodiment described herein.

FIG. 4B is a plan view of the resistance test structure depicted in FIG. 4A.

FIG. 8 Illustrates a front contact isolation test structure that can be formed on a solar cell substrate according to one embodiment described herein.

FIG. 9 Illustrates a back contact isolation test structure that can be formed on a solar cell substrate according to one embodiment described herein.

DETAILED DESCRIPTION

Embodiments of the present invention generally relate to a module that can test and analyze various regions of a solar cell device in an automated or manual fashion after one or more steps have been completed in the solar cell formation process. While the discussion below primarily describes the formation of a silicon thin film solar cell device, this configuration is not intended to be limiting to the scope of the invention since the apparatus and methods disclosed herein could be used to test and analyze other types of solar cell devices formed from materials, such as III-V type solar cells, thin film chalcogenide solar cells (e.g., CIGS, CdTe cells), amorphous or nanocrystalline silicon solar cells, photochemical type solar cells (e.g., dye sensitized), crystalline silicon solar cells, organic type solar cells or other similar solar cell devices. The module used to perform the automated testing and analysis processes can also be adapted to test a partially formed solar cell at various stages of the solar cell formation process within an automated solar cell production line. The automated solar cell production line is generally an arrangement of automated processing modules and automation equipment that is used to form solar cell devices. The automated solar cell production line generally comprises a substrate receiving module that is adapted to receive a substrate, one or more absorbing layer deposition cluster tools having at least one processing chamber that is adapted to deposit a silicon-containing layer on a surface of the substrate, one or more back contact deposition chambers that is adapted to deposit a back contact layer on a surface of the substrate, one or more material removal chambers that are adapted to remove material from a surface of the substrate, a solar cell encapsulation device such as a laminator, an autoclave module that is adapted to heat and expose a composite substrate structure to a pressure greater than atmospheric pressure, a junction box attaching module to attach a connection element that allows the solar cells to be connected to external components, and one or more quality assurance modules that are adapted to test and qualify the solar cell device. The one or more quality assurance modules generally include a solar parametric testing module, a solar simulator, and a shunt bust and qualification module.

Figure 1A:
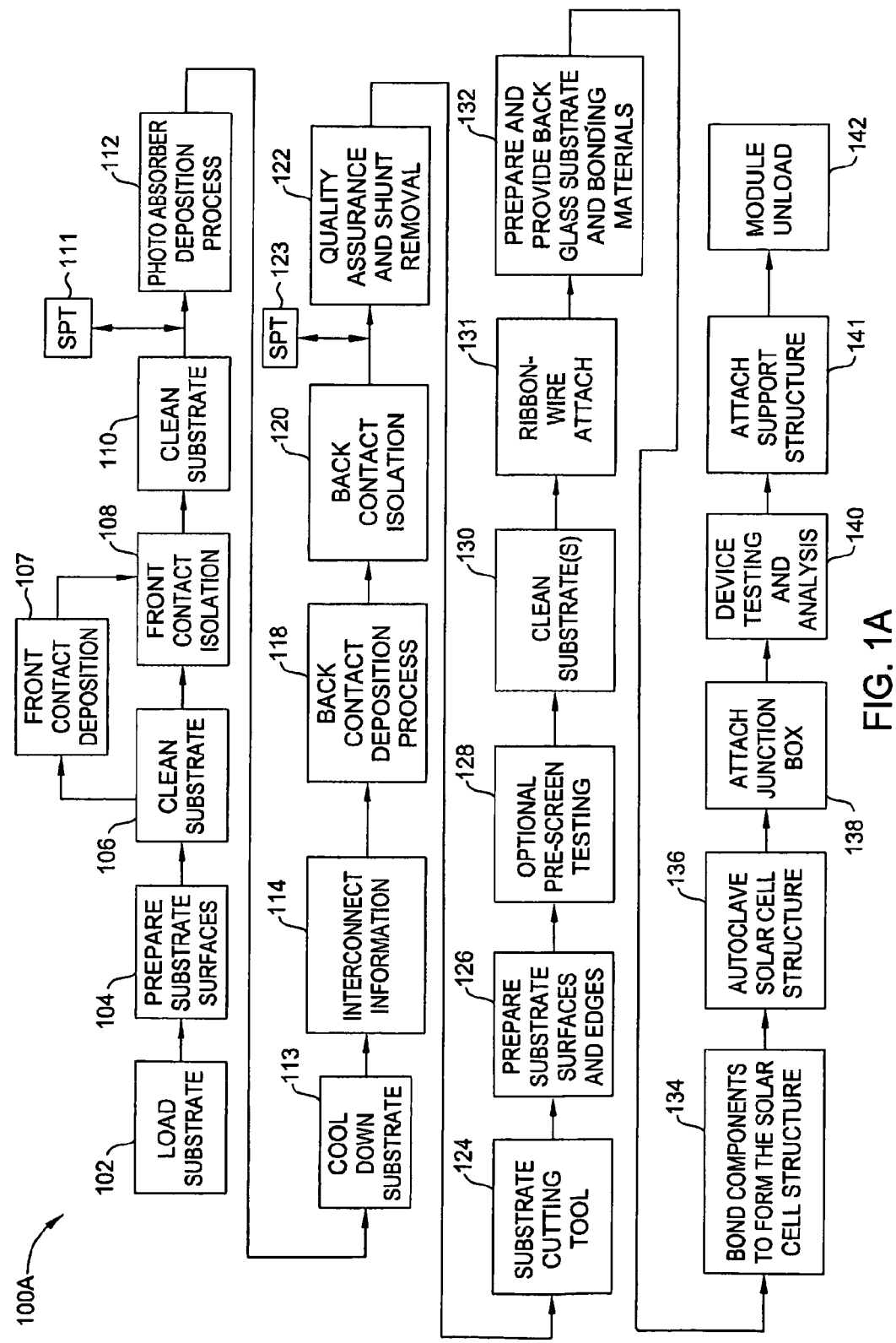
FIG. 1A illustrates a process sequence according to one embodiment described herein.
Figure 2:
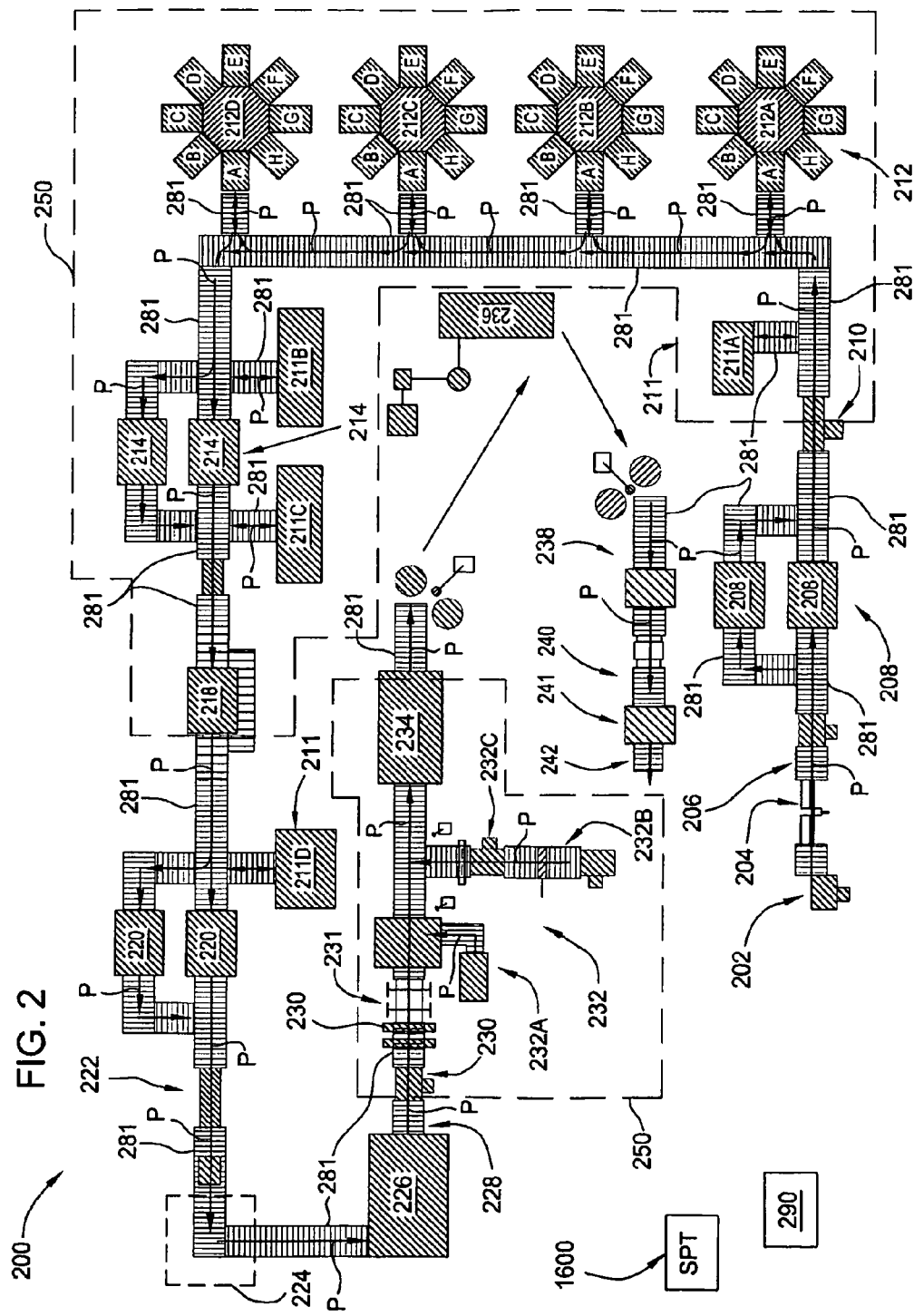
FIG. 2 illustrates a plan view of a solar cell production line according to one embodiment described herein.

FIG. 1A illustrates one embodiment of a process sequence 100A that includes a plurality of steps (i.e., steps 102-142) that are each used to form a solar cell device using a novel solar cell production line 200 described herein. The configuration, number of processing steps, and order of the processing steps in the process sequence 100A is not intended to be limiting to the scope of the invention described herein. FIG. 2 is a plan view of one embodiment of the production line 200, which is intended to illustrate some of the typical processing modules and process flows through the system and other related aspects of the system design, and is thus not intended to be limiting to the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also includes a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
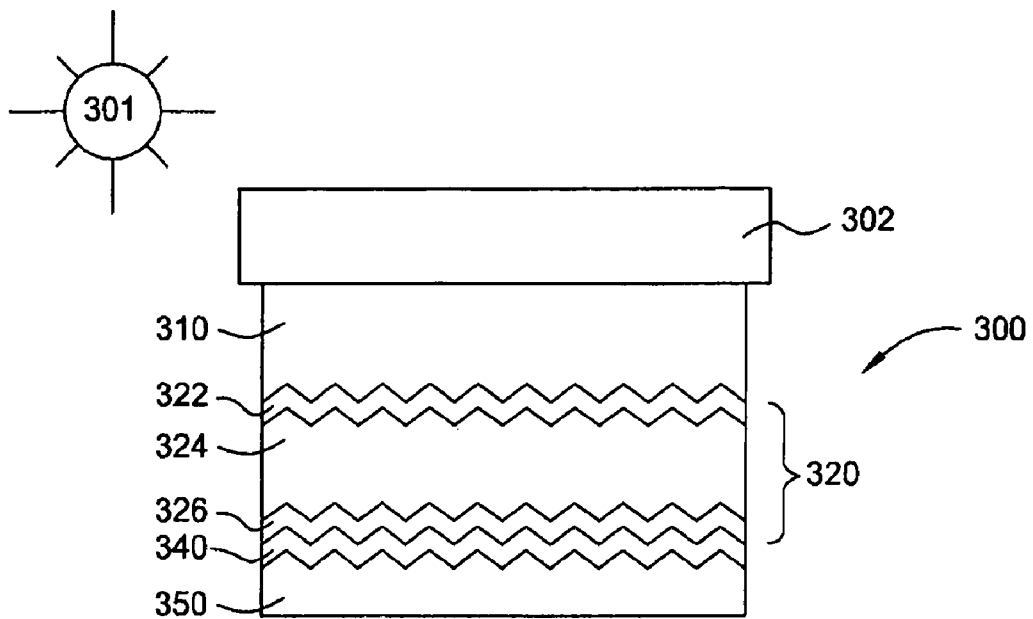
FIG. 3A is a side cross-sectional view of a thin film solar cell device according to one embodiment described herein.

Examples of a solar cell 300 that can be formed and tested using the process sequences illustrated in FIG. 1A and the components illustrated in the solar cell production line 200 are illustrated in FIGS. 3A-3E. FIG. 3A is a simplified schematic diagram of a single junction amorphous silicon solar cell 300 that can be formed and analyzed in the system described below.

As shown in FIG. 3A, the single junction amorphous silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a front contact layer, or first transparent conducting oxide (TCO) layer 310 (e.g., zinc oxide (ZnO), tin oxide (SnO)), formed over the substrate 302, a first absorber layer, or first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from the group consisting of Al, Ag, Ti, Cr, Au, Cu, Pt, Ni, Mo, conductive carbon, alloys thereof, and combinations thereof.

Figure 3B:
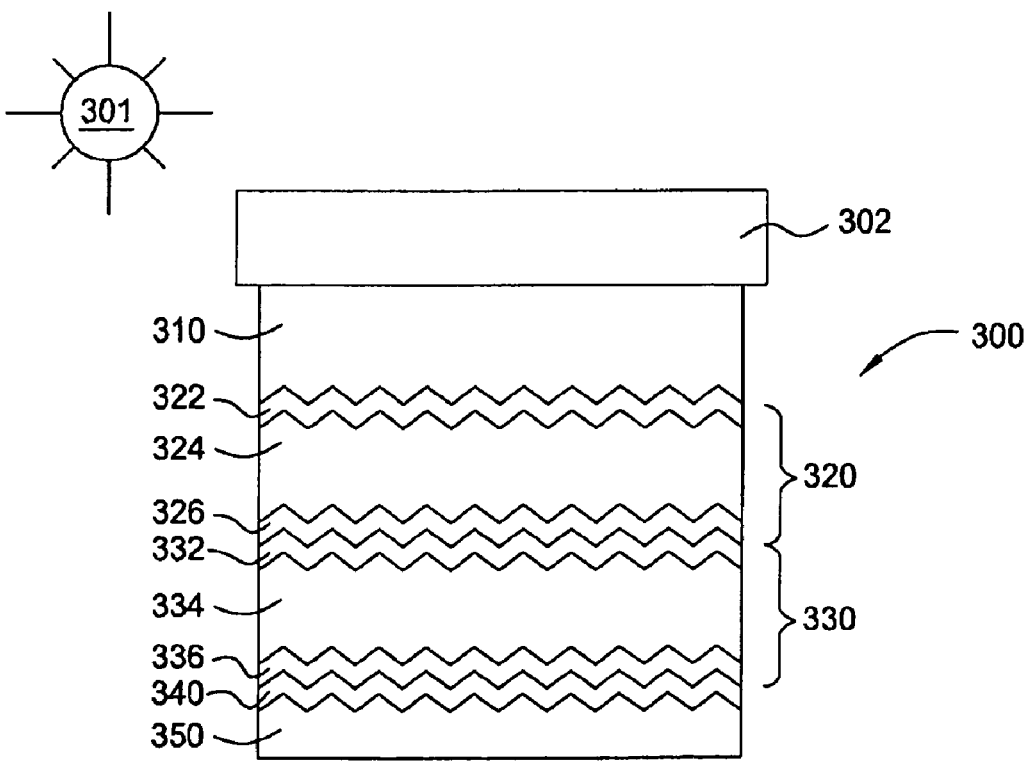
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second absorber layer or second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, Ni, Mo, conductive carbon, alloys thereof, and combinations thereof.

Figure 3C:
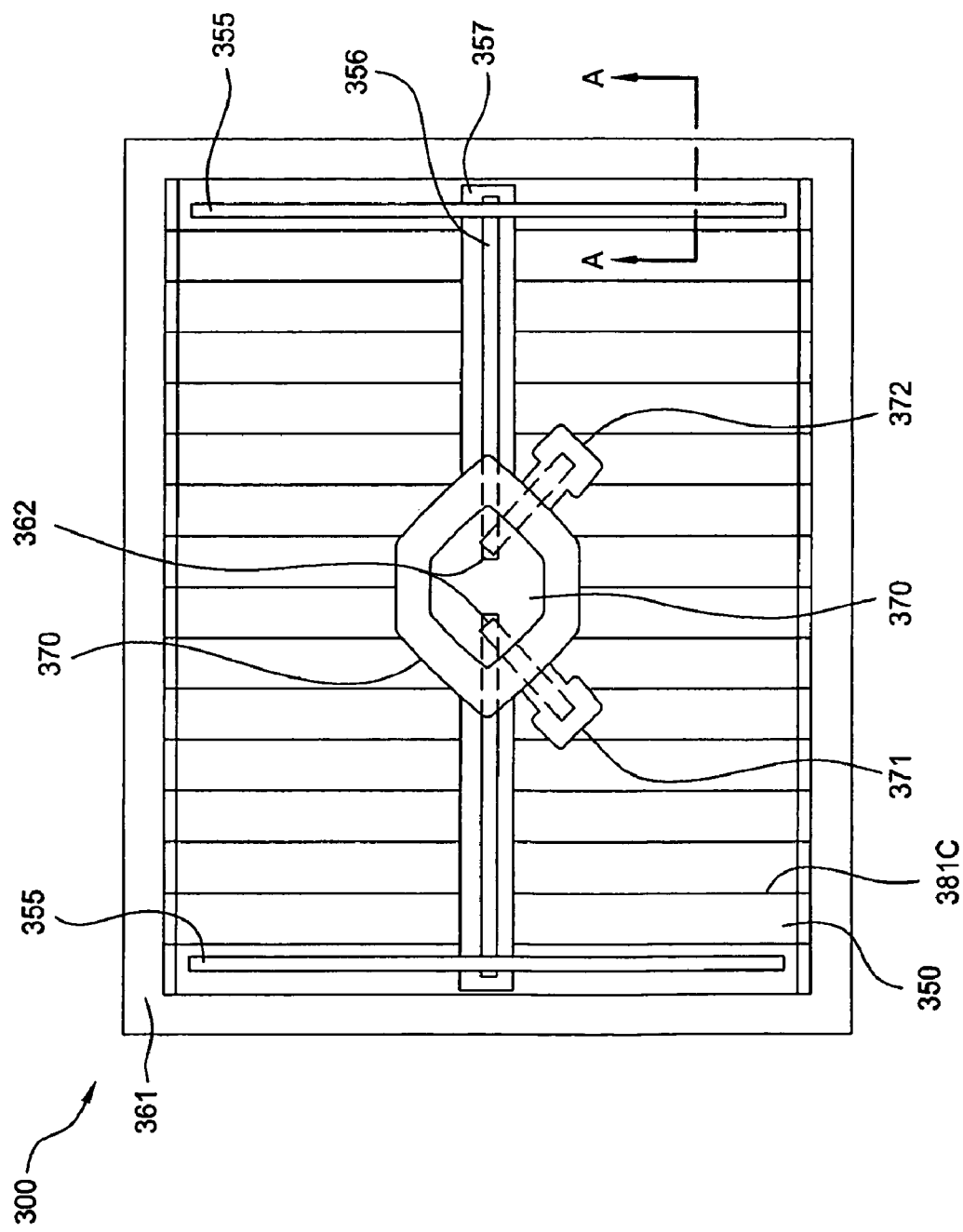
FIG. 3C is a plan view of a composite solar cell structure according to one embodiment described herein.
Figure 3D:
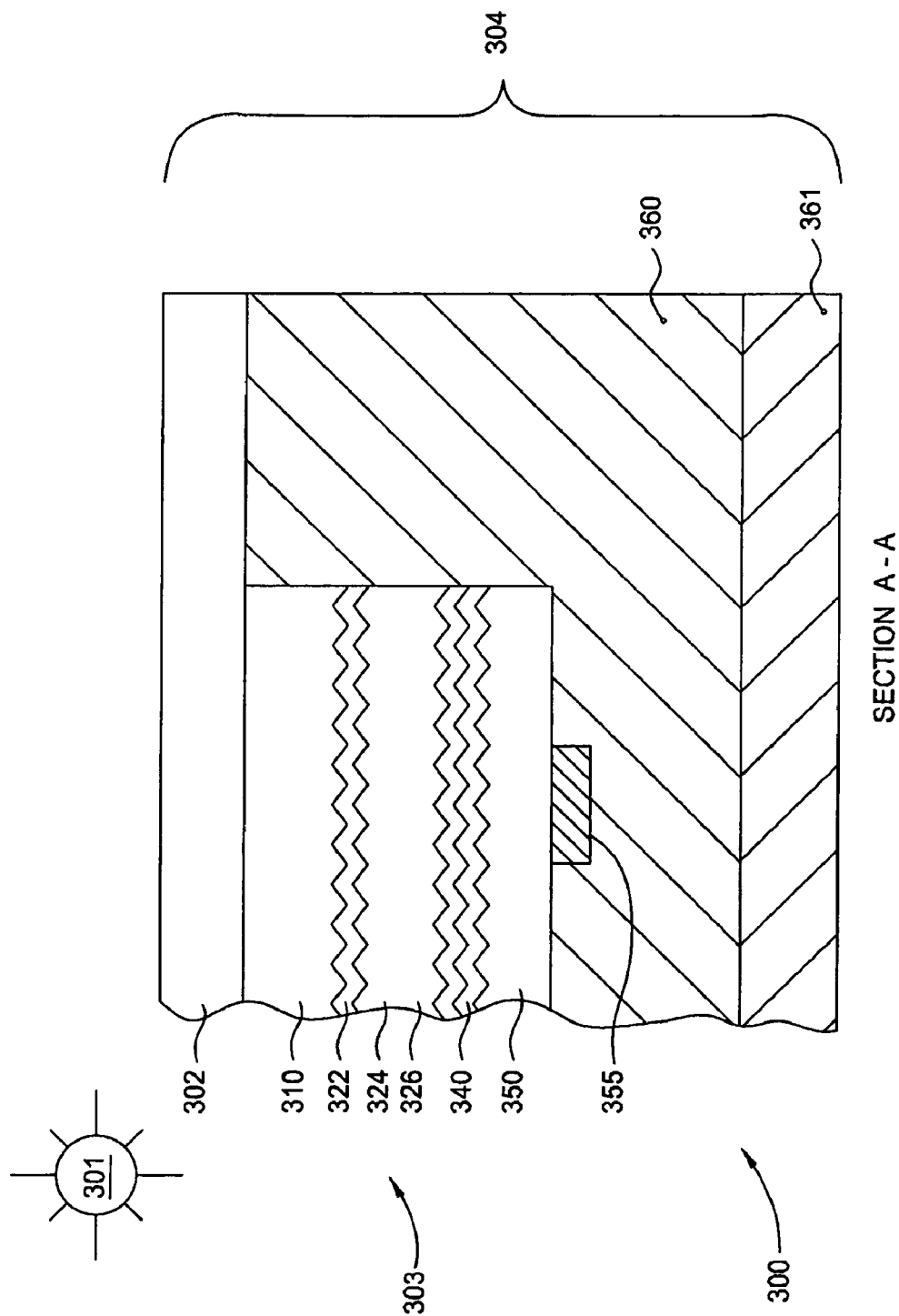
FIG. 3D is a side cross-sectional view along Section A-A of FIG. 3C.

FIG. 3C is a plan view that schematically illustrates an example of the rear surface of a formed solar cell 300 that has been produced and tested in the production line 200. FIG. 3D is a side cross-sectional view of a portion of the solar cell 300 illustrated in FIG. 3C (see section A-A). While FIG. 3D illustrates the cross-section of a single junction cell similar to the configuration described in FIG. 3A, this is not intended to be limiting as to the scope of the invention described herein.

As shown in FIGS. 3C and 3D, the solar cell 300 may contain a substrate 302, the solar cell device elements (e.g., reference numerals 310-350), one or more internal electrical connections (e.g., side-buss 355, cross-buss 356), a layer of bonding material 360, a back glass substrate 361, and a junction box 370. The junction box 370 may generally contain two junction box terminals 371, 372 that are electrically connected to leads 362 of the solar cell 300 through the side-buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side-buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

FIG. 3E is a schematic cross-section of a solar cell 300 illustrating various scribed regions used to form the individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3E this configuration is not intended to be limiting to the scope of the invention described herein.

General Solar Cell Formation Process Sequence

Referring to FIGS. 1A and 2, the process sequence 100A generally starts at step 102 in which a substrate 302 is loaded into the loading module 202 found in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In one embodiment, the substrates 302 or 303 are loaded into the solar cell production line 200 in a sequential fashion, and thus do not use a cassette or batch style substrate loading system. A cassette style and/or batch loading type system that requires the substrates to be un-loaded from the cassette, processed, and then returned to the cassette before moving to the next step in the process sequence can be time consuming and decrease the solar cell production line throughput. The use of batch processing does not facilitate certain embodiments of the present invention, such as fabricating multiple solar cell devices from a single substrate. Additionally, the use of a batch style process sequence generally prevents the use of an asynchronous flow of substrates through the production line, which may provide improved substrate throughput during steady state processing and when one or more modules are brought down for maintenance or due to a fault condition. Generally, batch or cassette based schemes are not able to achieve the throughput of the production line described herein, when one or more processing modules are brought down for maintenance, or even during normal operation, since the queuing and loading of substrates can require a significant amount of overhead time.

In the next step, step 104, the surfaces of the substrate 302 are prepared to prevent yield issues later on in the process. In one embodiment of step 104, the substrate is inserted into a front end seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next the substrate 302 or 303 is transported to the cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants.

In one example, the process of cleaning the substrate 302 or 303 may occur as follows. First, the substrate 302 or 303 enters a contaminant removal section of the cleaning module 206 from either a transfer table or an automation device 281. In general, the system controller 290 establishes the timing for each substrate 302 or 303 that enters the cleaning module 206. The contaminant removal section may utilize dry cylindrical brushes in conjunction with a vacuum system to dislodge and extract contaminants from the surface of the substrate 302. Next, a conveyor within the cleaning module 206 transfers the substrate 302 or 303 to a pre-rinse section, where spray tubes dispense hot DI water at a temperature, for example, of 50° C. from a DI water heater onto a surface of the substrate 302 or 303. Commonly, since the device substrate 303 has a TCO layer disposed thereon, and since TCO layers are generally electron absorbing materials, DI water is used to avoid any traces of possible contamination and ionizing of the TCO layer. Next, the rinsed substrate 302, 303 enters a wash section. In the wash section, the substrate 302 or 303 is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in a final rinse section of the cleaning module 206, the substrate 302 or 303 is rinsed with water at ambient temperature to remove any traces of contaminants. Finally, in a drying section, an air blower is used to dry the substrate 302 or 303 with hot air. In one configuration a deionization bar is used to remove the electrical charge from the substrate 302 or 303 at the completion of the drying process.

In the next step, or step 108, separate cells are electrically isolated from one another via scribing processes. Contamination particles on the TCO surface and/or on the bare glass surface can interfere with the scribing procedure. In laser scribing, for example, if the laser beam runs across a particle, it may be unable to scribe a continuous line, resulting in a short circuit between cells. In addition, any particulate debris present in the scribed pattern and/or on the TCO of the cells after scribing can cause shunting and non-uniformities between layers. Therefore, a well-defined and well-maintained process is generally needed to ensure that contamination is removed throughout the production process. In one embodiment, the cleaning module 206 is available from the Energy and Environment Solutions division of Applied Materials in Santa Clara, Calif.

Referring to FIGS. 1A and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region includes a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next the device substrate 303 is transported to the scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. The success criteria for step 108 are to achieve good cell-to-cell and cell-to-edge isolation while minimizing the scribe area.

In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 m$^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

It may be desirable to assure that the temperature of the device substrates 303 entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the device substrate 303 temperature to about 25+/−0.5° C.

Next the device substrate 303 is transported to the cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step. In one embodiment, a cleaning process similar to the processes described in step 106 above is performed on the device substrate 303 to remove any contaminants on the surface(s) of the device substrate 303.

Next, the device substrate 303 is transported to the processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100A, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions found in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to the scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

It may be desirable to assure that the temperature of the device substrates 303 entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the processing module 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form the back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that includes a metal layer selected from a group consisting of zinc (Zn), tin (Sn), aluminum (Al), copper (Cu), silver (Ag), nickel (Ni), vanadium (V), molybdenum (Mo), and conductive carbon. In one example, a zinc oxide (ZnO) or nickel vanadium alloy (NiV) is used to form at least a portion of the back contact layer 305. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the device substrate 303 surface to form lines that electrically isolate one solar cell from the next. In one embodiment, a 5.7 m$^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

Next, the device substrate 303 is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

In one embodiment of the process sequence 100A, the quality assurance module 222 and factory automation system are used together to resolve quality issues found in a formed device substrate 303 during the quality assurance testing. In one case, a device substrate 303 may be sent back upstream in the processing sequence to allow one or more of the fabrication steps to be re-performed on the device substrate 303 (e.g., back contact isolation step (step 120)) to correct one or more quality issues with the processed device substrate 303.

Next, the device substrate 303 is optionally transported to the substrate sectioning module 224 in which a substrate sectioning step 124 is used to cut the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the sectioning module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100A prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1A and 2, the device substrate 303 is next transported to the seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell.

In one embodiment, a grinding wheel is used to grind the deposited material from the edge regions of the device substrate 303. In another embodiment, dual grinding wheels are used to remove the deposited material from the edge of the device substrate 303. In yet another embodiment, grit blasting or laser ablation techniques are used to remove the deposited material from the edge of the device substrate 303. In one embodiment, one or more grinding wheels are preferred over blasting techniques in order to reduce the amount of potentially contaminating particles that may be introduced by grit blasting. In one aspect, the seamer/edge deletion module 226 is used to round or bevel the edges of the device substrate 303 by use of shaped grinding wheels, angled and aligned belt sanders, and/or abrasive wheels.

Next the device substrate 303 is transported to the pre-screen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next the device substrate 303 is transported to the cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate 303 to remove any contaminants on the surface(s) of the substrate 303.

Next the substrate 303 is transported to a bonding wire attach module 231 in which a bonding wire attach step 131 is performed on the substrate 303. Step 131 is used to attach the various wires/leads required to connect various external electrical components to the formed solar cell 300. The bonding wire attach module 231 is an automated wire bonding tool that reliably and quickly forms the numerous interconnects required to produce large solar cells 300 in the production line 200.

In one embodiment, the bonding wire attach module 231 is used to form the side-buss 355 (FIG. 3C) and cross-buss 356 on the formed back contact region. In this configuration, the side-buss 355 may comprise a conductive material that can be affixed, bonded, and/or fused to the back contact layer 350 in the back contact region to form a robust electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry current delivered by the solar cell 300 and that can be reliably bonded to the back contact layer 350 in the back contact region. In one embodiment, the metal strip is between about 2 mm and about 10 mm wide and between about 1 mm and about 3 mm thick.

The cross-buss 356, which is electrically connected to the side-buss 355 at junctions, can be electrically isolated from the back contact layer(s) 350 of the solar cell 300 by use of an insulating material 357, such as an insulating tape. The ends of each of the cross-busses 356 generally have one or more leads 362 that are used to connect the side-buss 355 and the cross-buss 356 to the electrical connections found in a junction box 370, which is used to connect the formed solar cell 300 to other external electrical components.

In the next step, step 132, a bonding material 360 (FIG. 3D) and "back glass" substrate 361 are prepared for delivery into the solar cell formation process (i.e., process sequence 100A). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of sub-steps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

The tolerance stack up of the various components in the bonded device (Step 134) can be an issue when forming large solar cells. Therefore, accurate control of the bonding material properties and tolerances of the cutting process assure that a reliable hermetic seal is formed. In one embodiment, PVB may be used to advantage due to its UV stability, moisture resistance, thermal cycling, good US fire rating, compliance with Intl Building Code, low cost, and reworkable thermoplastic properties.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., front end seaming module 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Common contaminants may include materials deposited on the substrate 361 during the substrate forming process (e.g., glass manufacturing process) and/or during shipping of the substrates 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next the device substrate 303, the back glass substrate 361, and the bonding material 360 are transported to the bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side-buss 355 to remain exposed so that electrical connections can be made to these regions of the solar cell structure 304 in future steps (i.e., step 138).

Next the composite solar cell structure 304 is transported to the autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304.

Next the solar cell structure 304 is transported to the junction box attachment module 238 in which junction box attachment steps 138 are performed on the formed solar cell structure 304. The junction box attachment module 238, used during step 138, is used to install a junction box 370 (FIG. 3C) on a partially formed solar cell. The installed junction box 370 acts as an interface between the external electrical components that will connect to the formed solar cell, such as other solar cells or a power grid, and the internal electrical connections points, such as the leads, formed during step 131. In one embodiment, the junction box 370 includes one or more junction box terminals 371, 372 so that the formed solar cell can be easily and systematically connected to other external devices to deliver the generated electrical power.

Next the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped.

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Solar Parametric Test Structures and Processes

Figure 1B:
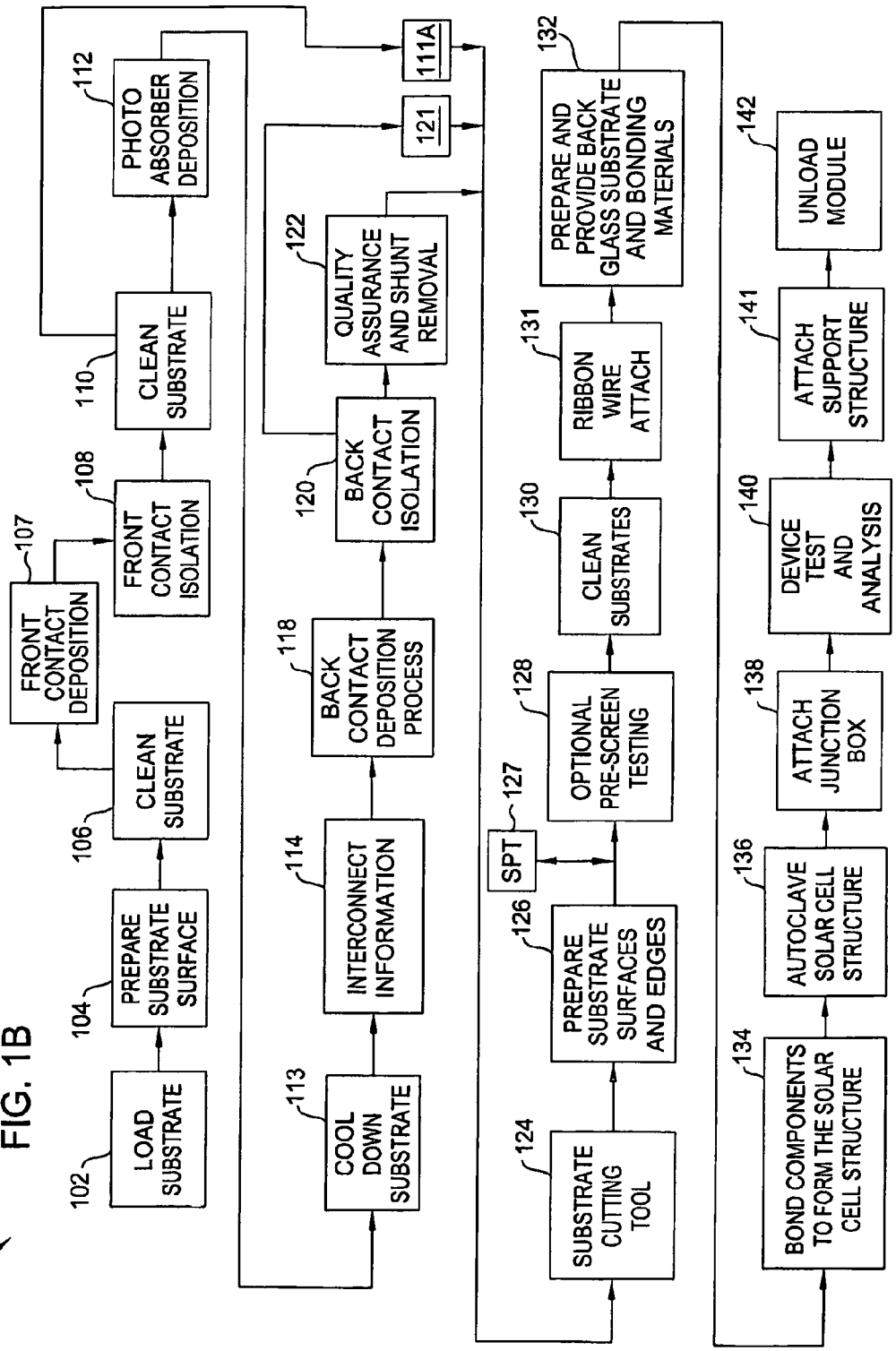
FIG. 1B illustrates a process sequence according to one embodiment described herein.

Referring to FIG. 1A, in one embodiment, the processing sequence 100A includes a plurality of testing and analysis steps, such as steps 111 and 123 that are used to test and analyze various regions, or test structures, formed on a portion of a partially formed solar cell device. FIG. 1B illustrates a processing sequence 100B, which is similar to processing sequence 100A, that is discussed further below.

In general, test structures may be regions or scribed areas formed on or within the layers formed on the substrate 302, which are designed to determine information about the processes performed in the processing sequence 100A or 100B on the production line 200. Examples of test structures that may be formed on one or more regions of the substrate 302 are further discussed below in conjunction with FIGS. 4-11. Further discussion of test structures and methods of testing the test structures may be found in U.S. Patent Application Ser. No. 61/043,060, filed Apr. 7, 2008, which is incorporated by reference herein.

One example of a test structure that may be used in conjunction with one or more of the embodiments described herein is illustrated in FIGS. 4A and 4B. FIG. 4A is a schematic cross-sectional diagram of a resistance test structure 400 formed in the deposited layers on the substrate 302. FIG. 4B is a plan view of the test structure 400 according to one embodiment of the present invention. The test structure 400 includes the front contact layer or first TCO layer 310, the first absorber layer or first p-i-n junction 320, and the back contact layer 350 all deposited on the substrate 302. Active portions of the device substrate 303 formed on the substrate 302 are isolated from the test structure 400 by isolation grooves 431. The isolation grooves 431 may be formed via the same material removal processes, or scribing processes, used to form the trenches 381A-381C (FIG. 3E) via the scribe modules 208, 214, and 220 in the respective steps 108, 114, and 120.

In one embodiment, a measurement module 1660 of a solar parametric testing module 1600 is used to measure the electrical properties of the back contact layer 350 in the test structure 400. During the measurement process, the measuring module 1660 applies a voltage between probe points in contact with probe pins 1651 and 1654, and the back contact layer resistance is determined from the voltage drop measured between the probe points in contact with probe pins 1652 and 1653. If the electrical characteristics of the test structure 400 are not within a desired range, corrective action can be taken with respect to one or more of the processing steps in the processing sequence 100A or 100B to assure that the performance of solar cells 300 formed in the solar cell production line 200 are within a desired range.

Figure 5A:
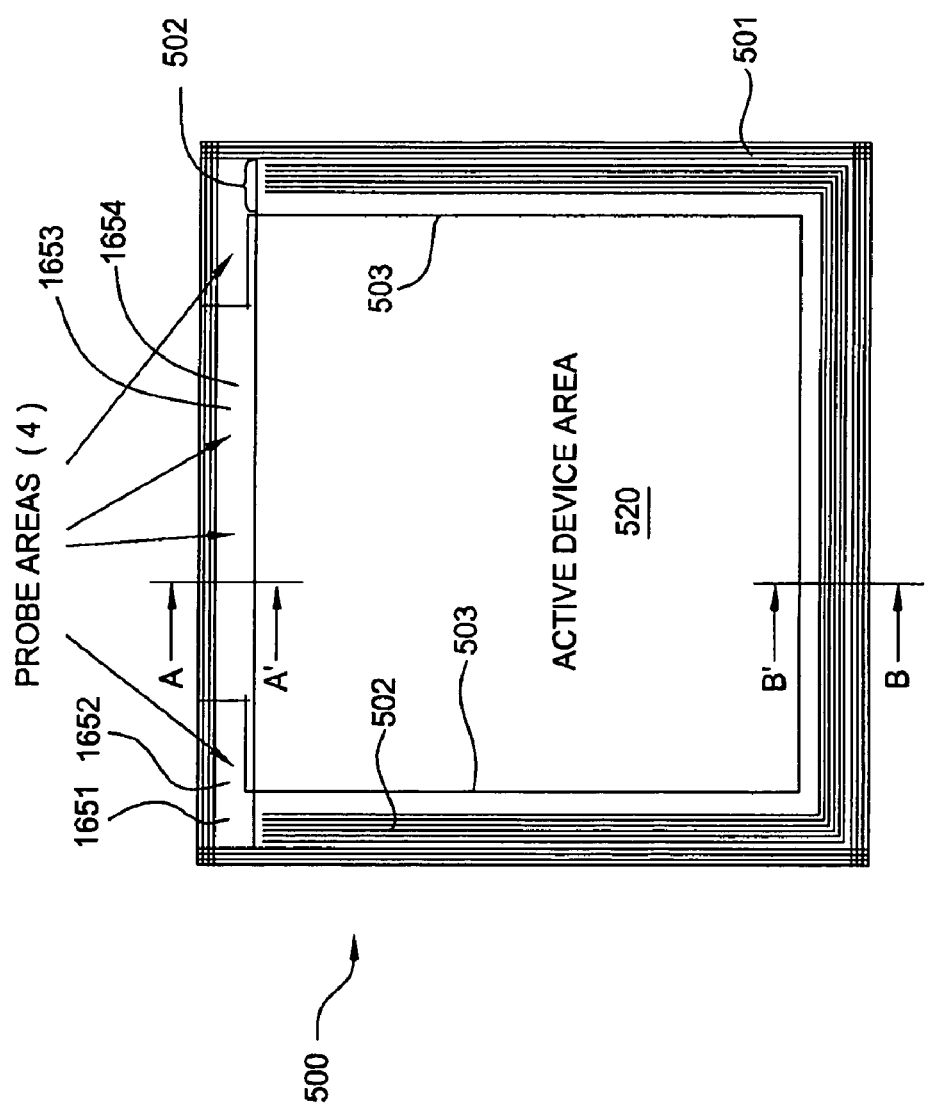
FIG. 5A is a plan view of a solar cell performance test structure that can be formed on a solar cell substrate according to one embodiment described herein.
Figure 5B:
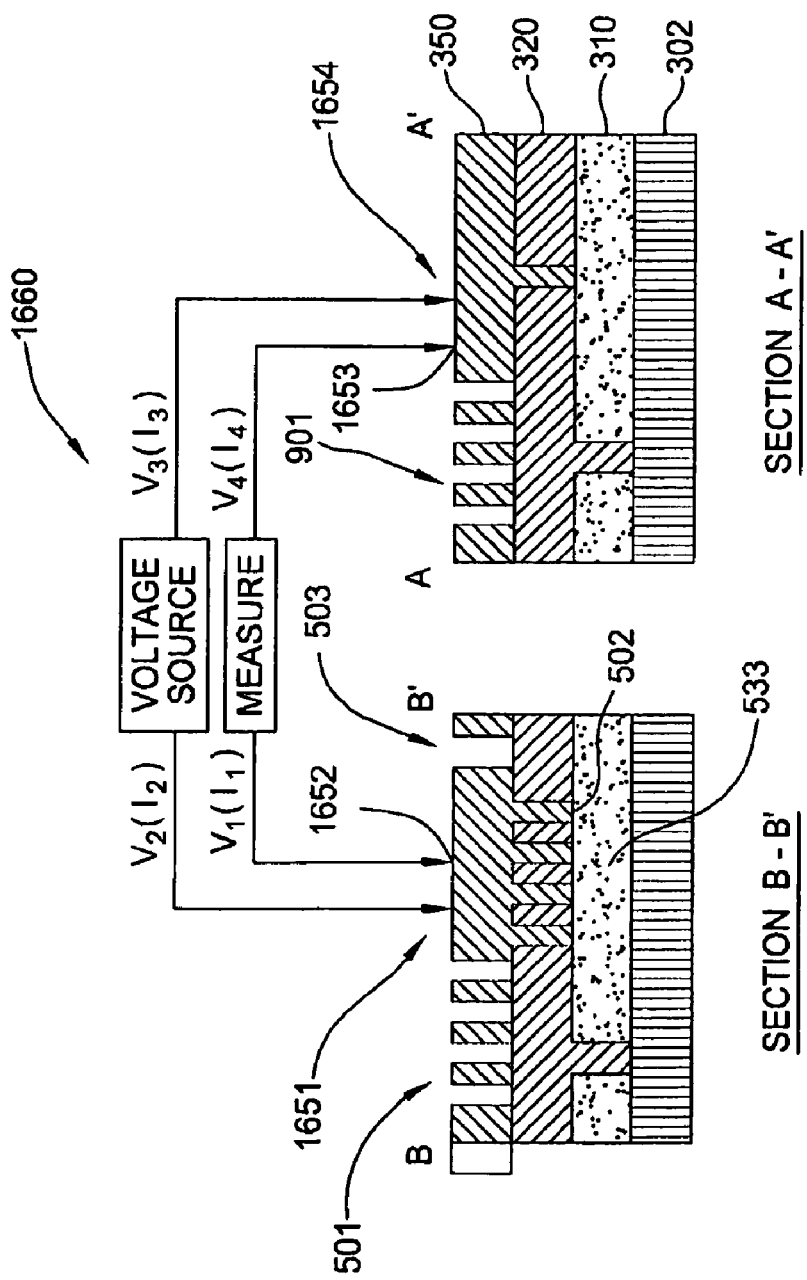
FIG. 5B illustrates two cross-sectional views of the test structure illustrated in FIG. 5A according to one embodiment described herein.

FIG. 5A is a plan view of a solar cell performance test structure, or test structure 500, which is used to test the performance of a formed photovoltaic junction, such as the first p-i-n junction 320 (FIG. 3A). In some cases, the test structure 500 may be used to test the quantum efficiency, the dark current/voltage (I-V) characteristics, the light current/voltage characteristics, and the fill factor of a solar cell device being formed in the production line 200. Solar cell performance characteristics requiring the delivery of some form of light energy may be simulated using the SPT module 1600 discussed below. FIG. 5B illustrates two cross-sectional views, i.e., section view A-A' and section view B-B', which schematically illustrate various portions of the test structure 500 and a desired probe orientation during the testing process performed in the SPT module 1600.

In one embodiment, test structure 500 is defined in a region on the substrate 302 via laser scribe lines 501, corresponding to trench 381C (FIG. 3E), which are formed through the back contact layer 350 via scribe module 220 during step 120. The scribe lines 501 electrically isolate the test structure 500 from other regions of the solar cell device substrate 303 formed on the substrate 302. Multiple parallel scribe lines 501 may be used to improve electrical isolation. Scribe lines 503, also corresponding to trenches 381C, which are also formed via scribe module 220 during step 120, electrically isolate probe points in contact with the probe pins 1651 and 1652 from probe points in contact with the probe pins 1653 and 1654 so that the cell performance of an active device area 520 can be measured with the resistance measurement module 1660 of the SPT module 1600. The test structure 500 may further be defined by laser scribe lines 502, corresponding to trenches 381B, which are formed through the first p-i-n junction 320 via scribe module 214 during step 114. The scribe lines 502 create a contact region 533 between the back contact layer 350 and the first TCO layer 310.

For measurement of solar cell performance characteristics, the resistance measurement module 1660 of the SPT module 1600 contacts the test structure 500 at the probe points in contact with the probe pins 1651, 1652, 1653, and 1654 as illustrated schematically in FIG. 5B. If the performance characteristics of the test structure 500 are not within a desired range, corrective actions can be taken to one or more of the processing steps in the processing sequence 100A or 100B to assure that the performance of each solar cell 300 formed in the solar cell production line 200 are within a desired range.

Figure 6:
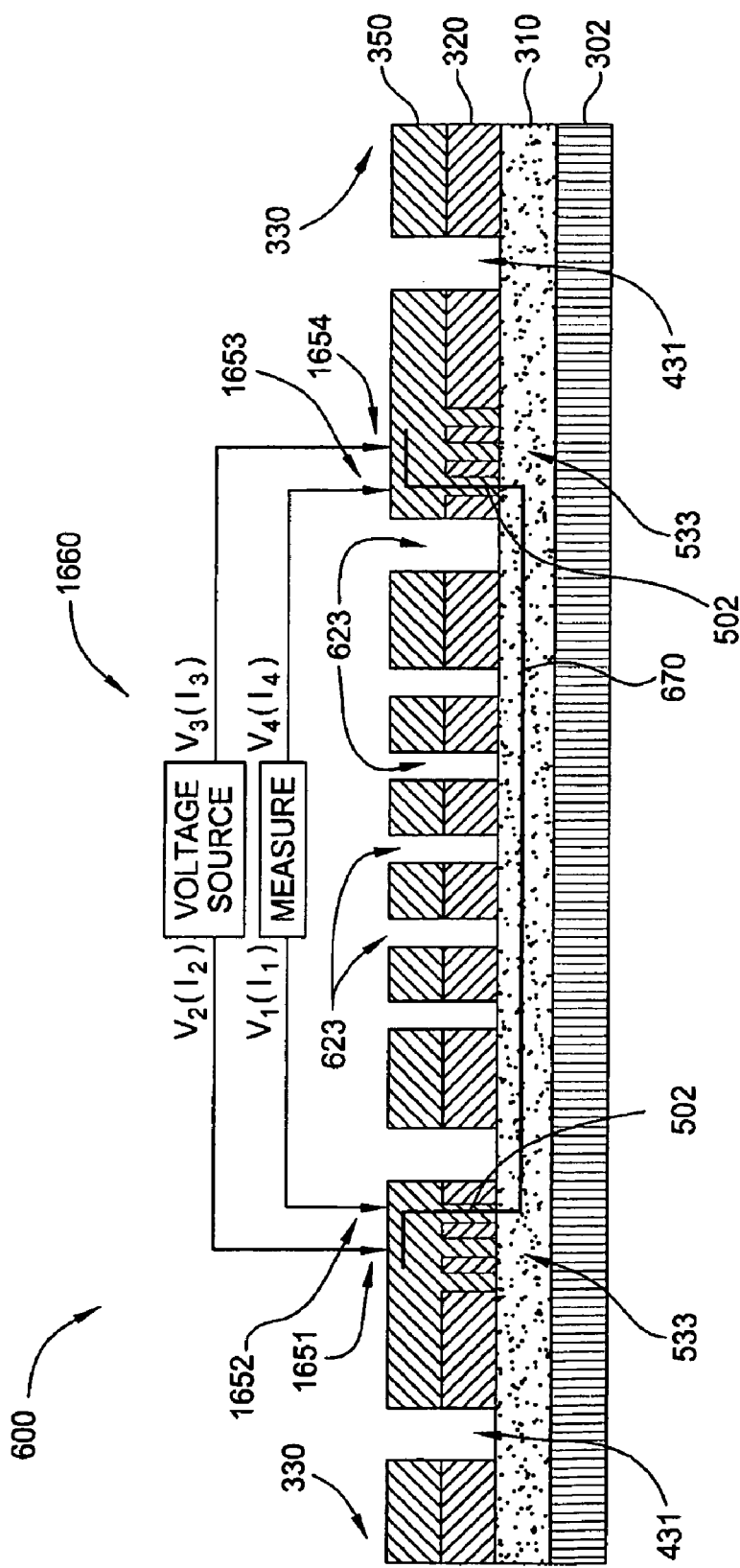
FIG. 6 is a schematic cross-sectional diagram of a front contact test structure that can be formed on a solar cell substrate according to one embodiment described herein.

FIG. 6 is a schematic cross-sectional diagram of a front contact test structure, or test structure 600, which is used in conjunction with the resistance measurement module 1660 to measure the first TCO layer 310 resistance to assure that the deposited layer has desirable properties (e.g., sheet resistance, thickness). Active portions of the device substrate 303 formed on the substrate 302 are isolated from the test structure 600 by isolation grooves 431 as described above with respect to FIG. 4. A contact region 533 is formed on each end of the test structure 600 via scribe lines 502 to provide a low resistance electrical path between the back contact layer 350 and the first TCO layer 310 as described above with respect to FIG. 5. In addition, the test structure 600 may include a plurality of inner grooves 623 formed in the first p-i-n junction layer 320 and back contact layer 350 as shown.

In one embodiment, the TCO film resistance is determined by applying a voltage between probe points in contact with the probe pins 1651 and 1654 and measuring the voltage drop between the probe points in contact with the probe pins 1652 and 1653 using the resistance measurement module 1660 of the SPT 1600. The formation of inner grooves 623, in conjunction with the contact regions 533, ensures that the testing current produced by the resistance measurement module 1660 follows an electrical path 670 as shown in FIG. 6. If the electrical characteristics of the test structure 600 are not within a desired range, corrective action can be taken with respect to one or more of the processing steps in the processing sequence 100A or 100B to assure that the performance of solar cells 300 formed in the solar cell production line 200 are within a desired range.

Figure 7:
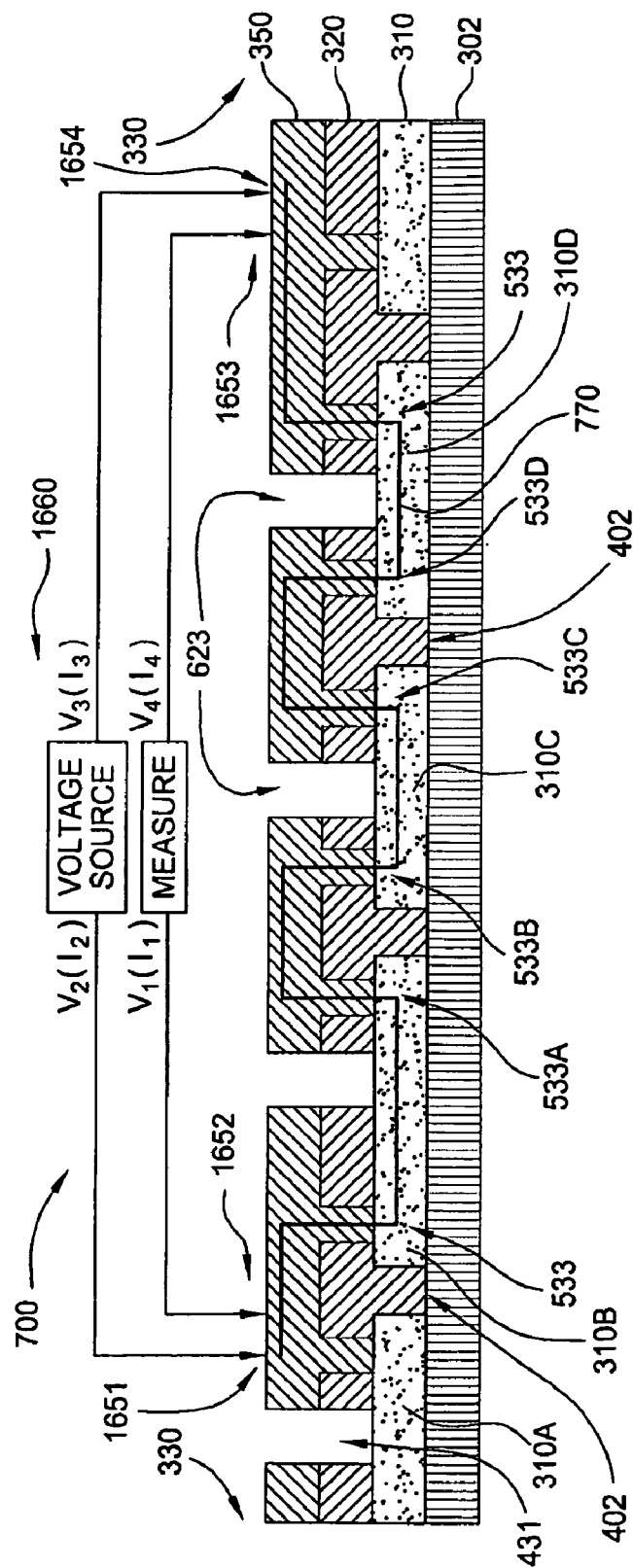
FIG. 7 illustrates a contact resistance test structure that can be formed on a solar cell substrate according to one embodiment described herein.

FIG. 7 illustrates one embodiment of a contact resistance test structure, or test structure 700, which is used in conjunction with the resistance measurement module 1660 to measure the average contact resistance formed between the first TCO layer 310 and the back contact layer 350. The test structure 700 may be isolated from active regions of the device substrate 303 by isolation grooves 431 as described with respect to FIG. 4. A contact region 533 (as described with respect to FIG. 5) may be formed on each end of the test structure 700. Portions of the first TCO layer 310 are removed prior to deposition of the first p-i-n junction layer 320, via the scribe module 214 in step 114, in order to separate the first TCO layer 310 into a plurality of segments, i.e. segments 310A-310D. Additional contact regions 533A-533D are also formed in the first p-i-n junction layer 320 such that each of the segments 310A-310D of the first TCO layer 310 is electrically coupled to each adjacent segment of segment of the first TCO layer 310 via a low-resistivity path through the back contact layer 350 as shown in FIG. 7. Thus, a test current flowing between probe points in contact with the probe pins 1651 and 1654 follow an electric path 770 through the segments 310A-310D of the first TCO layer 310 via the contact regions 533 and additional contact regions 533A-533D as shown in FIG. 7.

The contact resistance of the test structure 700 is determined by applying a voltage between probe points in contact with the probe pins 1651 and 1654 and determining the resistance by measuring the voltage drop between the probe points in contact with the probe pins 1652 and 1653 with the measuring module 1660 of the SPT 1600. If the electrical characteristics of the test structure 700 are not within a desired range, corrective action may be taken with respect to one or more of the processing steps in the processing sequence 100A or 100B to assure that the performance of solar cells 300 formed in the solar cell production line 200 are within a desired performance range.

FIG. 8 illustrates one embodiment of a front contact isolation test structure, or test structure 800, which is used in conjunction with the resistance measurement module 1660 to measure the effectiveness of isolation of regions of the first TCO layer 310. The test structure 800 may be isolated from active regions of the device substrate 303 by isolation grooves 431 as described with respect to FIG. 4. The test structure 800 includes a central region 801 that is surrounded by a peripheral region 802. TCO film isolation grooves 831 are formed between the central region 801 and the peripheral region 802 via the scribe module 208 in step 108. The effectiveness of the TCO layer isolation grooves 831 of the test structure 800 may be measured by a voltage between probe points in contact with the probe pins 1651 and 1654 and determining the resistance by measuring the voltage drop between the probe points in contact with the probe pins 1652 and 1653 with the measuring module 1660 of the SPT 1600. If the isolation grooves 831 are not formed completely through the first TCO layer 310, the electrical resistance between central region 801 and peripheral region 802 will be too low due to residual conductive material present at the bottom of the TCO layer isolation grooves 831. If the electrical characteristics of the test structure 800 are not within a desired range, corrective action can be taken with respect to the scribe module 208 and/or process step 108 to assure that the performance of the solar cells 300 formed in the solar cell production line 200 are within a desired performance range.

FIG. 9 illustrates one embodiment of a back contact isolation test structure, or test structure 900, which is used in conjunction with the resistance measurement module 1660 to measure the effectiveness of isolation regions formed in the back contact layer 350 via the scribe module 220 during step 120. Active portions of the device substrate 303 formed on the substrate 302 are isolated from the test structure 900 by isolation grooves 431 as described above with respect to FIG. 4. The test structure 900 includes a central region 901 that is surrounded by a peripheral region 902. Isolation grooves 931 are formed between the central region 901 and the peripheral region 902 via the scribe module 220 during step 120. The effectiveness of the isolation grooves 931 of the test structure 900 may be measured by applying a voltage between probe points in contact with the probe pins 1651 and 1654 and determining the resistance by measuring the voltage drop between the probe points in contact with the probe pins 1652 and 1653 with the measuring module 1660 of the SPT 1600. If the electrical characteristics of the test structure 900 are not within a desired range, corrective action can be taken with respect to the scribe module 220 and/or process step 120 to assure that the performance of the solar cells 300 formed in the solar cell production line 200 are within a desired performance range.

Figure 10:
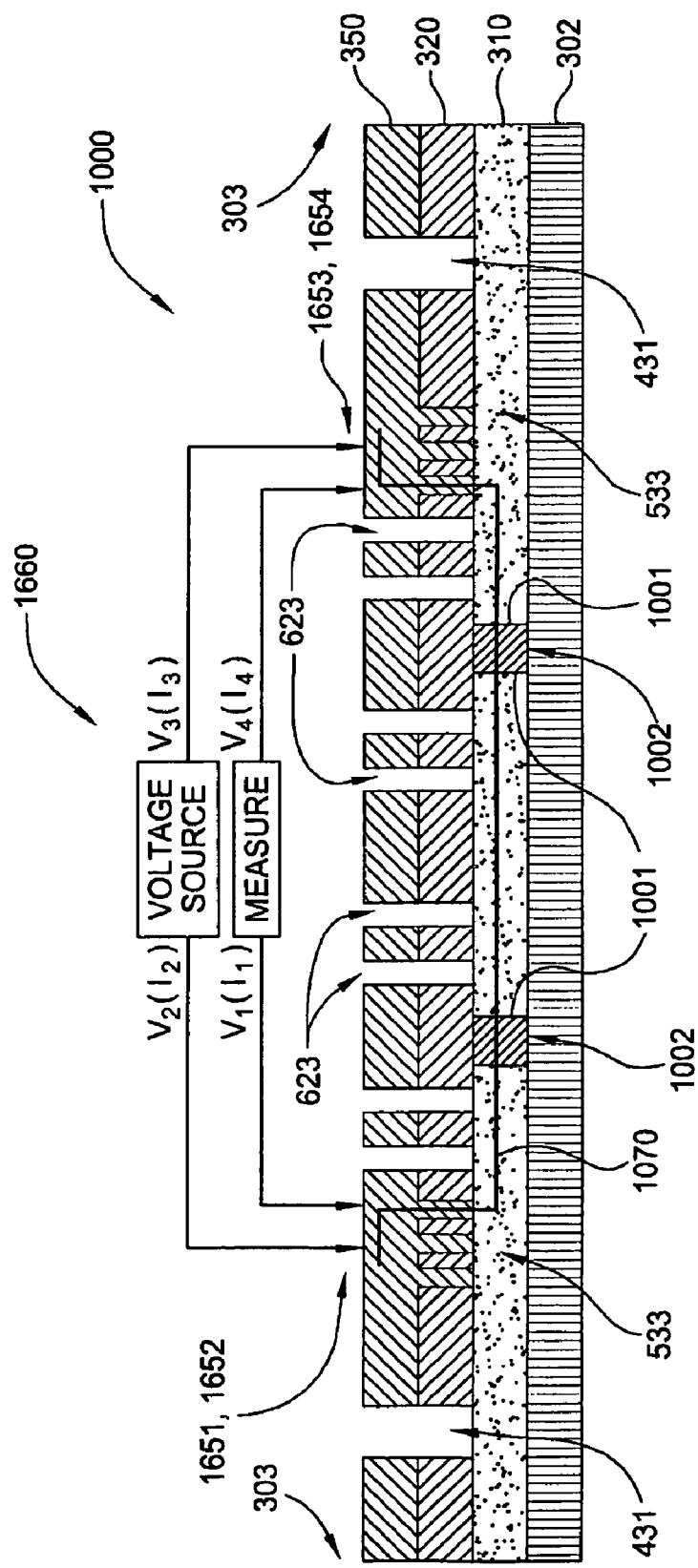
FIG. 10 Illustrates a front contact layer to absorber layer contact resistance test structure that can be formed on a solar cell substrate according to one embodiment described herein.

FIG. 10 illustrates one embodiment of a first TCO layer 310 to first p-i-n junction layer 320 contact resistance test structure, or test structure 1000, which is used in conjunction with the resistance measurement module 1660 to measure the average contact resistance formed between the first TCO layer 310 and the first p-i-n junction layer 320. Active portions of the device substrate 303 formed on the substrate 302 are isolated from the test structure 1000 by isolation grooves 431 as described above with respect to FIG. 4. A contact region 533 is formed at each end of the test structure 1000 as described above with respect to FIG. 5. Portions of the first TCO layer 310 are removed prior to deposition of the first p-i-n junction layer 320 so that gaps 1002 are formed in the first TCO layer 310, which are filled by the first p-i-n junction layer 320 during deposition to create part of an interface 1001. Additionally, a plurality of inner grooves 623 (as described with respect to FIG. 6) are located so that none of the inner grooves 623 coincide with the gaps 1002 formed in the first TCO layer 310. Thus, a test current flowing between probe points in contact with the probe pins 1651 and 1654 follows an electrical path 1070 through the first TCO layer 310 filled by the first p-i-n junction layer 320 and the interfaces 1001 on the sides of each gap 1002 as shown.

The contact resistance between the first TCO layer 310 and the first p-i-n junction 320 of the test structure 1000 is determined by applying a voltage between points in contact with the probe pins 1651 and 1654 and measuring the voltage drop between the probe points in contact with the probe pins 1652 and 1653 using the measuring module 1660 of the SPT module 1600. If the electrical characteristics of the test structure 1000 is not within a desired range corrective action can be taken with respect to one or more of the processing steps in the processing sequence 100A or 100B to assure that the performance of the solar cells 300 formed in the solar cell production line 200 are within a desired range.

Figure 11:
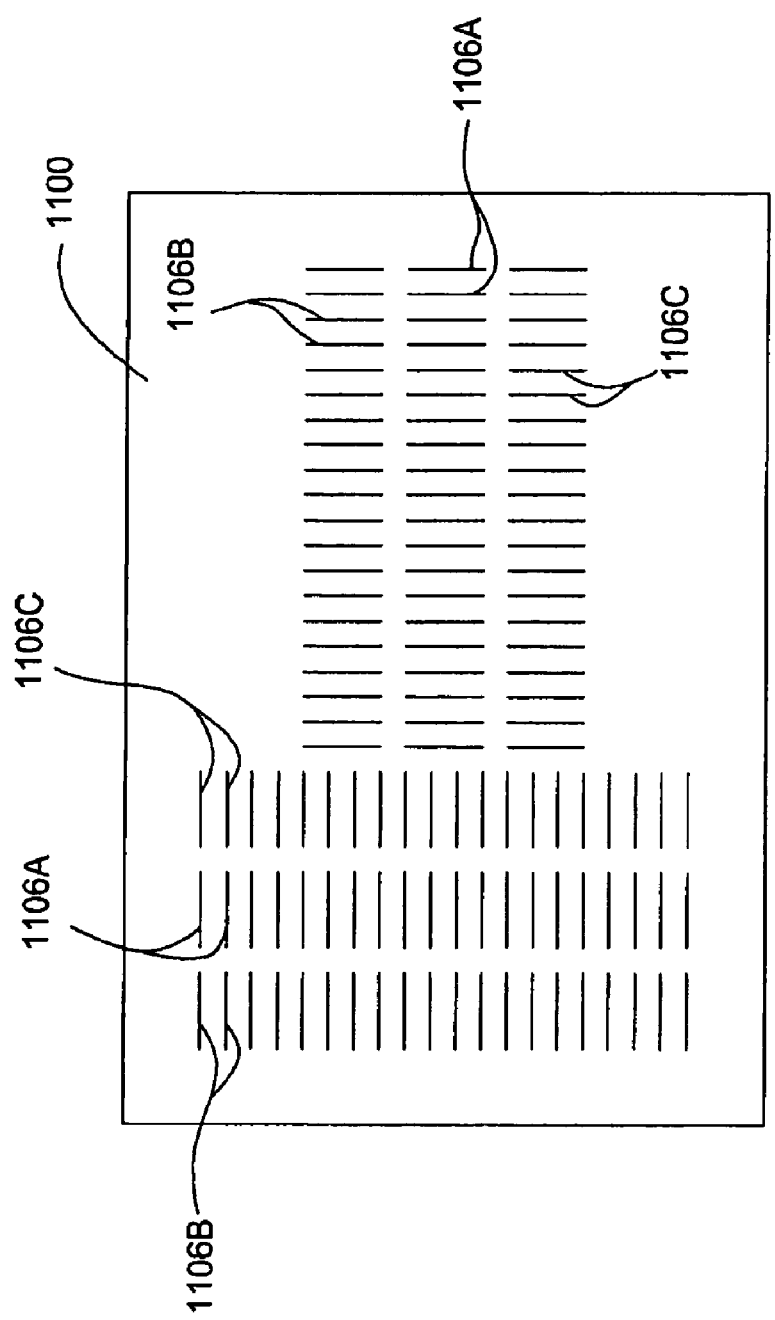
FIG. 11 is a plan view of a scribe alignment accuracy measurement test structure that can be formed on a solar cell substrate according to one embodiment described herein.

FIG. 11 is a plan view of a scribe alignment accuracy measurement test structure, or test structure 1100, formed on the substrate 302 in the production line 200. The test structure 1100 may be used to determine whether scribe lines, corresponding to the trenches 381A-381C (FIG. 3E), formed in the scribe modules 208, 214, and 220 during the steps 108, 114 and 120 are aligned with each other within a specified range. In one embodiment, the test structure 1100 includes a series of scribed lines 1106A, 1106B, and 1106C, corresponding to the trenches 381A, 381B, and 381C, formed in the device substrate 303 during the scribe module steps 108, 114 and 120, respectively. The layout of the each of the scribed lines 1106A-1106C in the test structure 1100 is generally formed in a pattern that allows for easy recognition of the relative amount of misalignment in any direction of the materials removed during the steps 108, 114 and 120. In one embodiment, the scribed lines 1106A-1106C are formed so that a vernier type scale is formed to help quantify the amount of misalignment of the scribe lines 1106A-1106C formed in any direction between each of the scribe modules 208, 214, 220. If the misalignment of the scribe lines 1106A-1106C in the test structure 1100 exceeds a desired amount, corrective actions can be taken with respect to one or more of the scribe modules 208, 214, and 220 to correct the alignment error. While FIG. 11 illustrates a test structure 1100 that includes three separate scribe processes, this is not intended to be limiting as to the scope of the invention.

Figure 12:
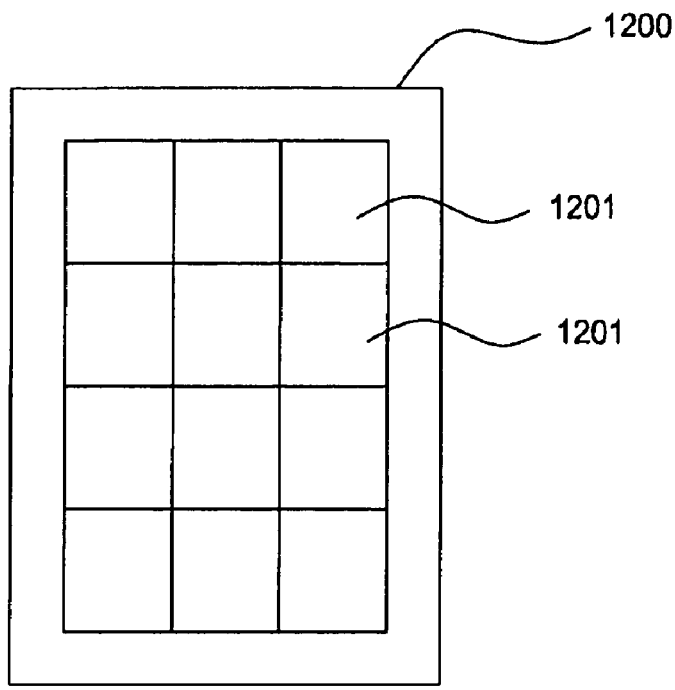
FIG. 12 is a plan view of a quarter section of a large area solar cell substrate that includes a plurality of testing modules according to one embodiment described herein.
Figure 13:
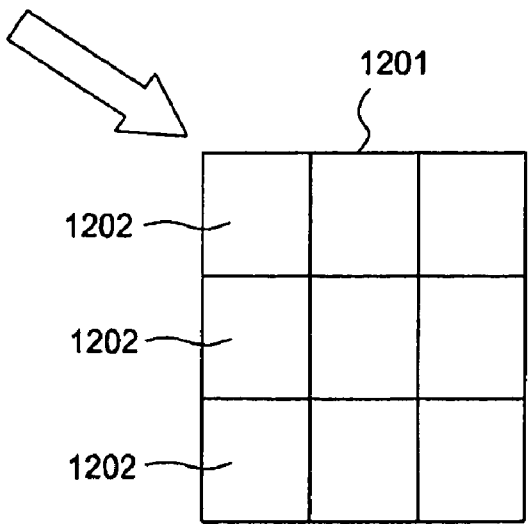
FIG. 13 is a plan view of a testing module having a plurality testing dice formed thereon according to one embodiment described herein.
Figure 14:
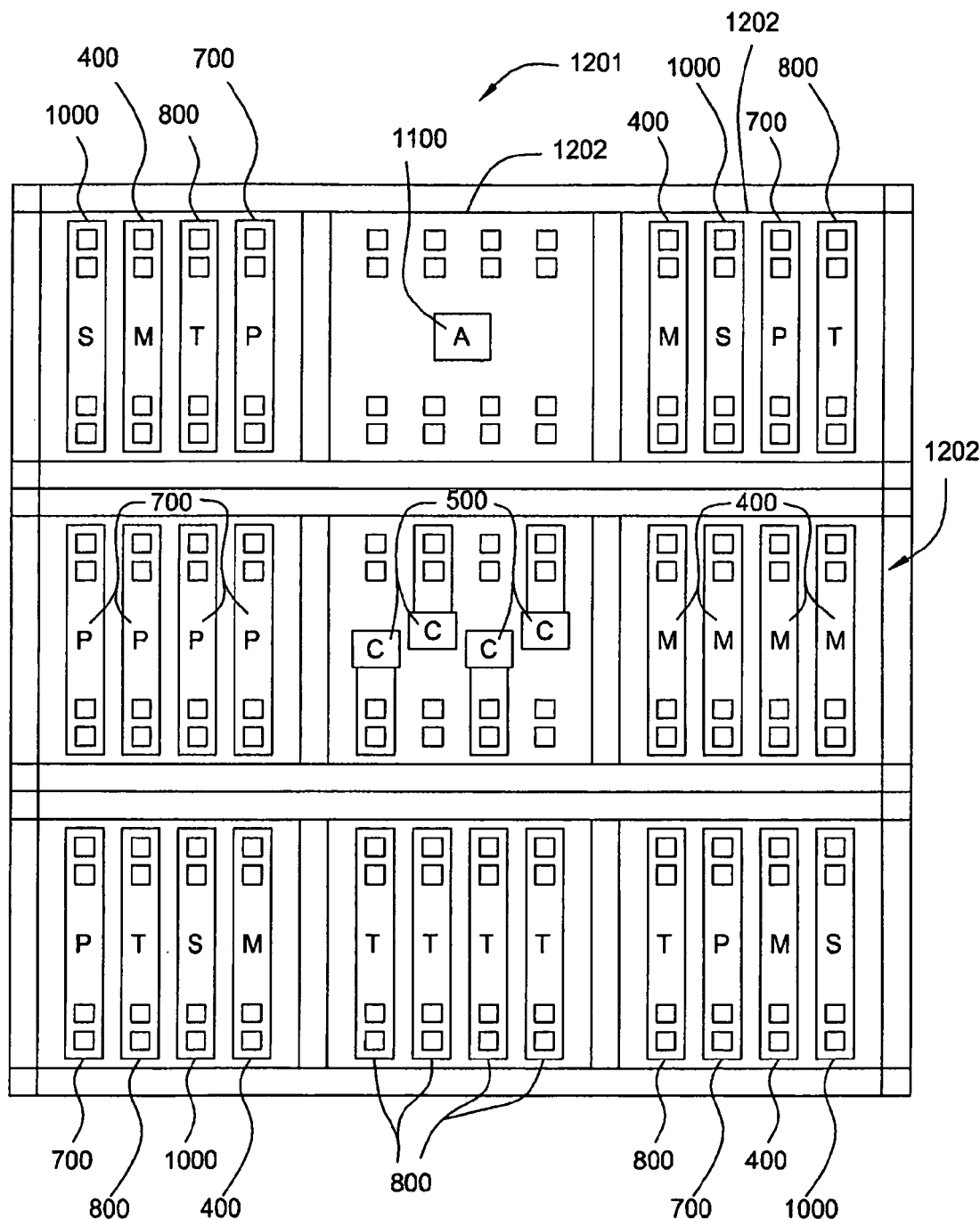
FIG. 14 Illustrates an exemplary layout of a testing module according to one embodiment described herein.

FIG. 12 is a plan view of quarter section 1200 of a 2.2 m×2.6 m sized solar cell substrate 302 that includes a plurality of testing modules 1201 that have been formed during one or more of the steps in the process sequence 100A or 100B. In one embodiment, each testing module 1201 is a 30 cm×30 cm section of the substrate 302 that includes a plurality of test structures 400-1100 formed thereon. As illustrated in FIG. 13, each testing module 1201 may include a plurality of test dice 1202 in which one or more test structures 400-1100, discussed above, are formed. In one embodiment, each test die 1202 is a 10 cm×10 cm section of the substrate 302 that includes a plurality of test structures 400-1100. FIG. 14 illustrates an exemplary layout of a testing module 1201 that includes nine test dice 1202. In this configuration each test die 1202 generally includes a plurality of test structures 400-1100 that are characterized as shown.

Figure 15:
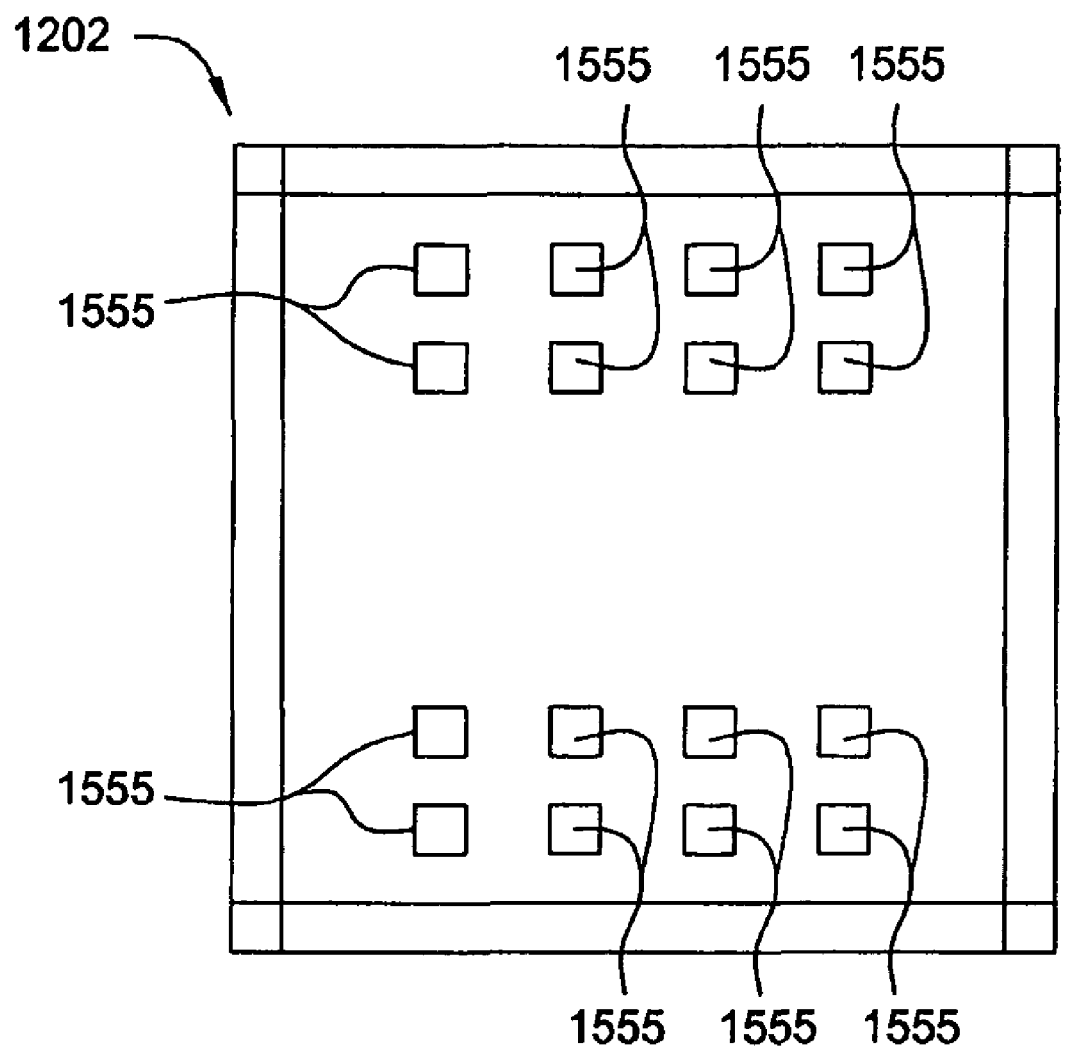
FIG. 15 is a plan view of a layout of probe locations formed in a measurement assembly according to one embodiment described herein.

FIG. 15 illustrates an example of a plan view of a layout of probe locations 1555 that is formed in a measurement assembly 1661 found in the resistance measurement module 1660, discussed below. By use of common probe locations 1555 on each test die 1202, the number of measurement assemblies 1661 that need to be created to test all of the possible testing structures found in each test die 1202 is reduced, thus reducing the cost and complexity of the measurement assembly 1661 and SPT module 1600.

FIG. 1B illustrates a process sequence 100B in which the device substrate 303 requires extra processing steps prior to performing the testing and analysis steps on the test structures 400-1100 formed on the substrate 302. In one embodiment, the extra processing steps include substrate cutting processes (e.g., step 124) and surface preparation processes (e.g., step 126) prior to performing a testing and analysis step 127. In this configuration, the device substrate 303 can be sectioned to isolate the various formed test structures 400-1100 from other active portions of the device substrate 303, such as solar cells 300. In this configuration, the parts of the device substrate 303 that do not require testing and analysis continue through the solar cell production line 200. The process sequence 100B may be especially useful in cases where the test structures 400-1100 are grouped within a quarter panel region (see FIG. 12) of the device larger substrate 303. Thus, the testing steps may be performed on the quarter panel section in an offline fashion.

In one embodiment, as illustrated in FIG. 1B, the one or more device substrates 303 can be removed from the processing sequence 100B at steps 111A or 121 and sent for further processing prior to performing step 127 in the SPT module 1600. In one case, steps 111A and 121 are transferring steps that are used to transport the device substrate 303 from the cleaning module 210 or the scribe module 220, respectively, to the next surface preparation step via the automation devices 281, or other automated or manual means.

Solar Parametric Testing Module

As shown in FIG. 2, the solar cell production line 200 may include one or more solar parametric testing (SPT) modules 1600 used to test and analyze various regions of a solar cell device in an automated fashion during different phases of the solar cell formation process. While FIG. 2 illustrates the SPT module 1600 in an off-line configuration, in which the module 1600 is not connected to the automation hardware in the solar cell production line 200, this configuration is not intended to be limiting as to the scope of the invention. In one embodiment, the SPT module 1600 is positioned to receive a device substrate 303 in an automated fashion from the automation device 281 positioned between the clean module 210 and the processing module 212. In another embodiment, the SPT module 1600 is positioned to receive a device substrate 303 in an automated fashion from the automation device 281 positioned between the scribe module 220 and the quality assurance module 222.

Figure 16A:
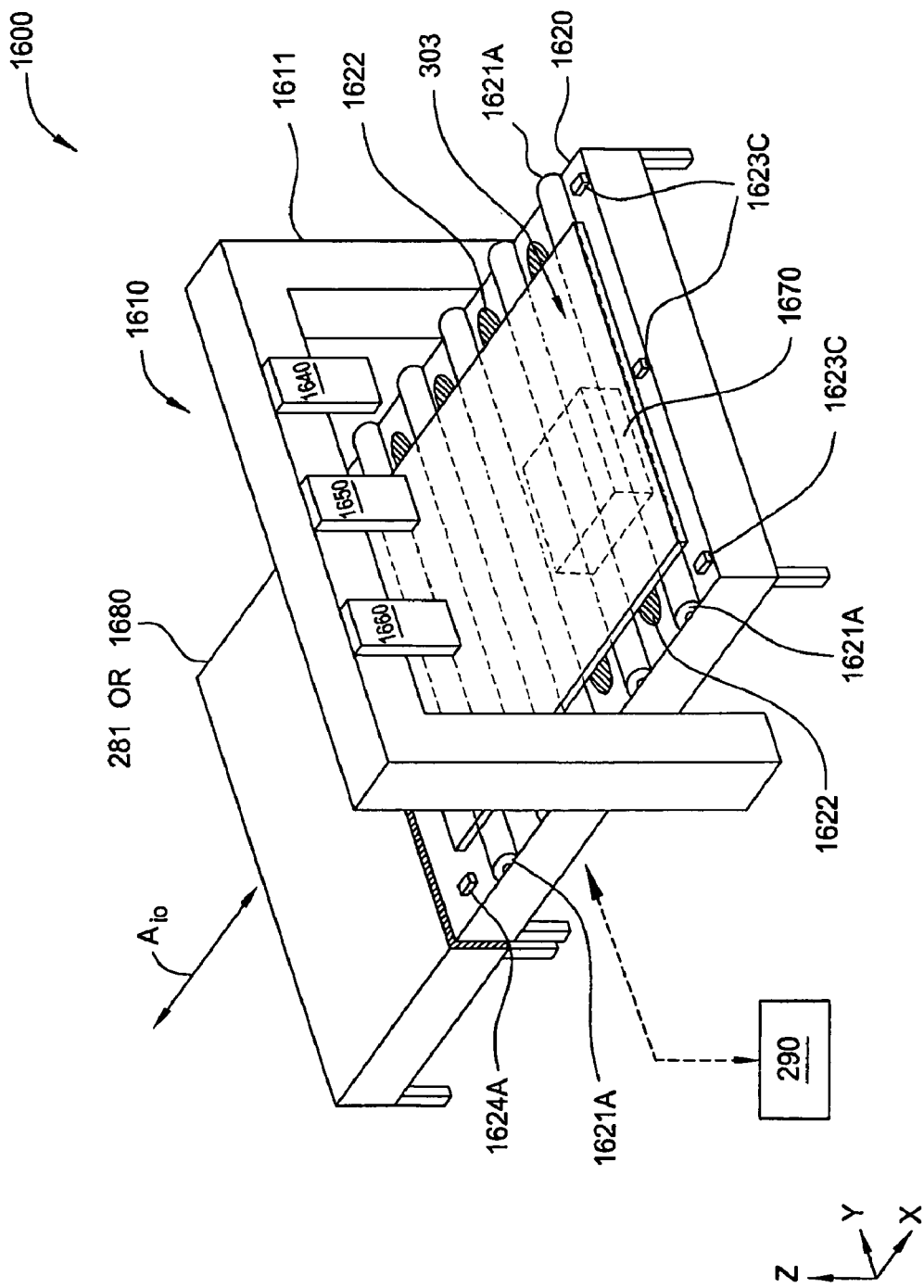
FIG. 16A is a schematic isometric view of a solar parametric testing module according to one embodiment described herein.
Figure 16B:
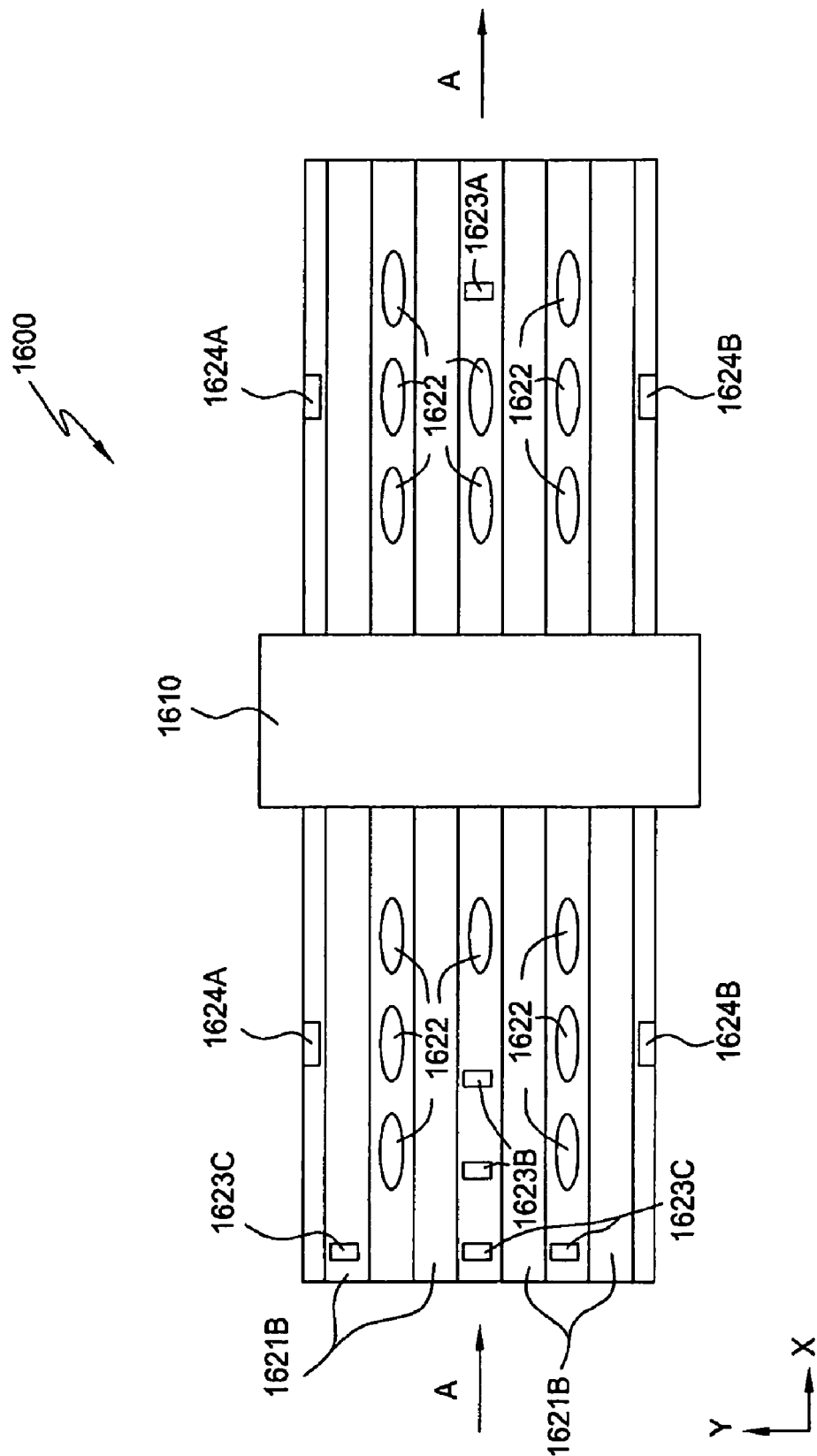
FIG. 16B is a schematic plan view of the module depicted in FIG. 16A.

FIGS. 16A and 16B illustrate one embodiment of the SPT module 1600 which may be useful to perform the processing sequence 1700, discussed below. FIG. 16A is a schematic isometric view of the SPT module 1600 according to one embodiment of the present invention. FIG. 16B is a schematic plan view of the SPT module 1600 depicted in FIG. 16A.

In one embodiment, the SPT module 1600 includes a test assembly 1610 and an automation assembly 1620, which are both in communication with the system controller 290. The test assembly 1610 generally includes a support truss, or support structure 1611, that is adapted to support and retain the various components used to perform one or more of the tests performed in the SPT module 1600 using commands sent from the system controller 290. In one embodiment, the test assembly 1610 comprises a vision system 1640, a solar cell efficiency module 1650, a resistance measurement module 1660, and a light source 1670 that are each in communication with the system controller 290.

In one embodiment, a device substrate 303 is transferred into the SPT module 1600 using a substrate support table 1680 that can be manually moved and connected up to the SPT module 1600 so that the device substrate 303 can be received by the automation assembly 1620 and tested. In another embodiment, the substrate support table 1680 is replaced by an automation device 281 that allows the SPT module 1600 to be connected to one or more automation components in the solar cell production line 200 so that each device substrate 303 can be handled in an automated fashion using commands sent from the system controller 290.

In one embodiment, the automation assembly 1620 includes a conveyor that has a plurality of conventional automated conveyor rollers 1621A, which are used to position the device substrate 303 within the SPT module 1600 in a controlled and automated fashion. In another embodiment, the automated conveyor rollers 1621A further comprise a series of belts 1621B that are used to support and position the device substrate 303.

The automation assembly 1620 may also include a plurality of frictionless support elements 1622 that are mounted to a supporting structure within the automation assembly 1620 to allow the device substrate 303 to be supported, moved, and positioned with minimum contact and abrasion of the substrate surfaces during the substrate alignment and/or the testing processes. In one configuration, the automated conveyor rollers 1621A are mounted on a moveable structure that allows the device substrate 303 to be disposed on and/or removed from the frictionless support elements 1622 by the relative movement between the rollers 1621A and the frictionless support elements 1622 by a conventional actuator assembly. The frictionless support elements 1622 may comprise a gas receiving plenum that has one or more plenum surfaces that have a plurality of holes formed therein.

In operation the holes are adapted to deliver a gas (e.g., air, $N_2$) from the gas receiving plenum to a surface of the substrate 303 that is disposed over the plenum surface. The gas delivered by the holes is thus used to "frictionlessly" support the device substrate 303 over the plenum surface so that it can be moved and aligned without contacting or abrading the surface of the device substrate 303. The use of the frictionless support elements 1622 also allows for a more precise control of the movement of the device substrate 303 versus using the automated conveyor belt system since the often small X-direction and Y-direction movements of a large device substrate 303 during alignment are sensitive to frictional forces resisting the alignment.

In one embodiment, the automation assembly 1620 includes various aligning and gripping members that are used to align, position, and move the device substrate 303 within the SPT module 1600. In one embodiment, the automation assembly 1620 includes a leading edge rough stop 1623A, one or more trailing edge rough stops 1623B, and one or more gripping members 1623C for retaining and moving the device substrate 303 during processing. In one embodiment, the leading edge rough stop 1623A, the one or more trailing edge rough stops 1623B, and the one or more griping members 1623C are each moveable in a vertical or Z-direction and horizontal or X-Y directions (FIGS. 16A-16B) to actively position and angularly align the retained device substrate 303 during processing.

In one embodiment, various configurations of leading edge rough stops 1623A and trailing edge rough stops 1623B are used to position each size of device substrate 303 that is processed in the SPT module 1600. That is, a size appropriate trailing edge stop 1623B may be used in conjunction with a leading edge rough stop 1623A as each different sized device substrate 303 is processed by the SPT module 1600. For example, one trailing edge stop 1623B may be appropriate for a full sized device substrate, such as 2200 mm×2600 mm×3 mm, and another trailing edge stop 1623B may be appropriate for a quarter sized device substrate, such as 1100 mm×1300 mm×3 mm.

In one embodiment, the automation assembly 1620 also includes one or more datum finding elements, such as one or more Y-axis datum elements 1624A and pusher elements 1624B for aligning an edge of the device substrate 303 to a known position within the SPT module 1600. In operation, after the leading edge of the device substrate 303 has been located by a physical stop and/or one or more sensors contained in the leading edge rough stops 1623A, the device substrate 303 is pressed against the Y-axis datum elements 1624A by the pusher elements 1624B to align the device substrate 303 to a known Y-axis position within the SPT module 1600.

In one embodiment, the automation assembly 1620 also includes a vision system 1640 for accurately aligning regions of the device substrate 303 to the elements of the SPT module 1600. In one embodiment, the vision system 1640 and system controller 290 are adapted to find one or more features on a device substrate 303 by scanning the device substrate with the vision system 1640. In one embodiment, the device substrate 303 is scanned by the vision system 1640 while the gripping members 1623C move the device substrate 303, which is supported on the frictionless support elements 1622 that allows both X-direction and Y-direction movement.

In one embodiment, the vision system 1640 includes at least one camera and other electronic components to locate, communicate, and store the position of features formed on or within the device substrate 303. For example, the vision system 1640 can be used to locate the various test structures 400-1100 or other scribed features (e.g., laser scribe in steps 108, 114, and 120) formed in the layers deposited on the device substrate 303. Due to tolerances in the substrate 302 received in step 102, the position of scribe lines can vary relative to one or more edges of the substrate 302, such that the variability can affect the device yield of the solar cell formation process. Once the desirable features of the device substrate 303 are located by the vision system 1640, the device substrate 303 is repositioned into a desired position so that the various testing steps can be performed on the one or more test structures 400-1100 formed on the device substrate 303.

In one embodiment, the vision system 1640 and software in the system controller 290 are used to monitor and/or characterize the misalignment of the scribe lines 1106A-1106C formed in the test structure 1100. In one embodiment, the vision system 1640 is used to magnify and display the test structure 1100 so that an operator can quantify the amount of misalignment of the scribe lines 1106A-1106C. In another embodiment, the vision system 1640 and the system controller 290 are used to analyze the test structure 1100 and automatically correct the error in misalignment or display the amount the amount of misalignment between each of the scribe lines 1106A-1106C.

Referring to FIGS. 4-10, 16A, and 16B, the resistance measurement module 1660 generally includes a measurement assembly 1661 and a plurality of probe pins 1651-1654 that are adapted to probe the various test structures 400-1000 that are to be analyzed. The measurement assembly 1661 may generally include one or more voltage sources connected to two or more of the probe pins, one or more current sources connected to two or more of the probe pins, one or more voltage measurement devices connected to two or more of the probe pins, and one or more current measurement devices connected to a probe pin. In one embodiment, the probe pins 1651-1654 are an array of "po-go" pins that are designed to reliably probe various desired regions of a test structure 400-1000 multiple times. In one embodiment, an array of 16 probe pins are arranged in a pattern similar to the probe locations 1555 illustrated in FIG. 15. In general, the resistance measurement module 1660 includes a probe pin supporting structure that can be actuated and positioned in one or more directions so that two or more probe pins can be placed in contact with desired points on the test structures formed on the substrate 302. In one embodiment, the probe pin supporting structure includes a plurality of probe pins (e.g., greater than 100 probe pins) that are adapted to concurrently probe each test structure 400-1000 formed on the substrate 302.

The solar cell efficiency module 1650 generally includes one or more components that can be used to characterize the performance of the device substrate 303 using the light source 1670. In one embodiment, as shown in FIG. 16A, the light source 1670 is positioned on a side of the device substrate 303 that is opposite to the side that the resistance measurement module 1660 is configured to probe. In one embodiment, the solar cell efficiency module 1650 is an automated assembly that is used in conjunction with the probe pins contained in the resistance measurement module 1660 and the light source 1670 to characterize the electrical characteristics of the device substrate 303.

In one embodiment, the solar cell efficiency module 1650 has a screen/cover (not shown) that can be positioned over a one or more of the test dice 1202 in an automated fashion to isolate the test structures (e.g., test structure 500) from stray or ambient light. Once the screen/cover is positioned to enclose the desired test die 1202 the light source 1670 is used project a known amount of light at one or more known wavelengths onto the device so that the current and voltage characteristics of the test structures, such as test structure 500, can be measured using the probe pins 1651-1654 and various measurement devices found in the resistance measurement module 1660. In one embodiment, the light source 1670 is a laser that is configured to deliver a desired amount of energy at a desired wavelength of light.

In one embodiment, the SPT module 1600 includes a bar code reader that is used to identify and log data collected in the module for each tested device substrate 303, so that trends and/or other substrate processing information can be subsequently reviewed and analyzed. The collected test data and bar code information can be stored and retrieved from one or more databases formed in one or more storage devices contained in the system controller 290 and managed by software contained therein.

Solar Parametric Tester Process Sequence

Figure 17:
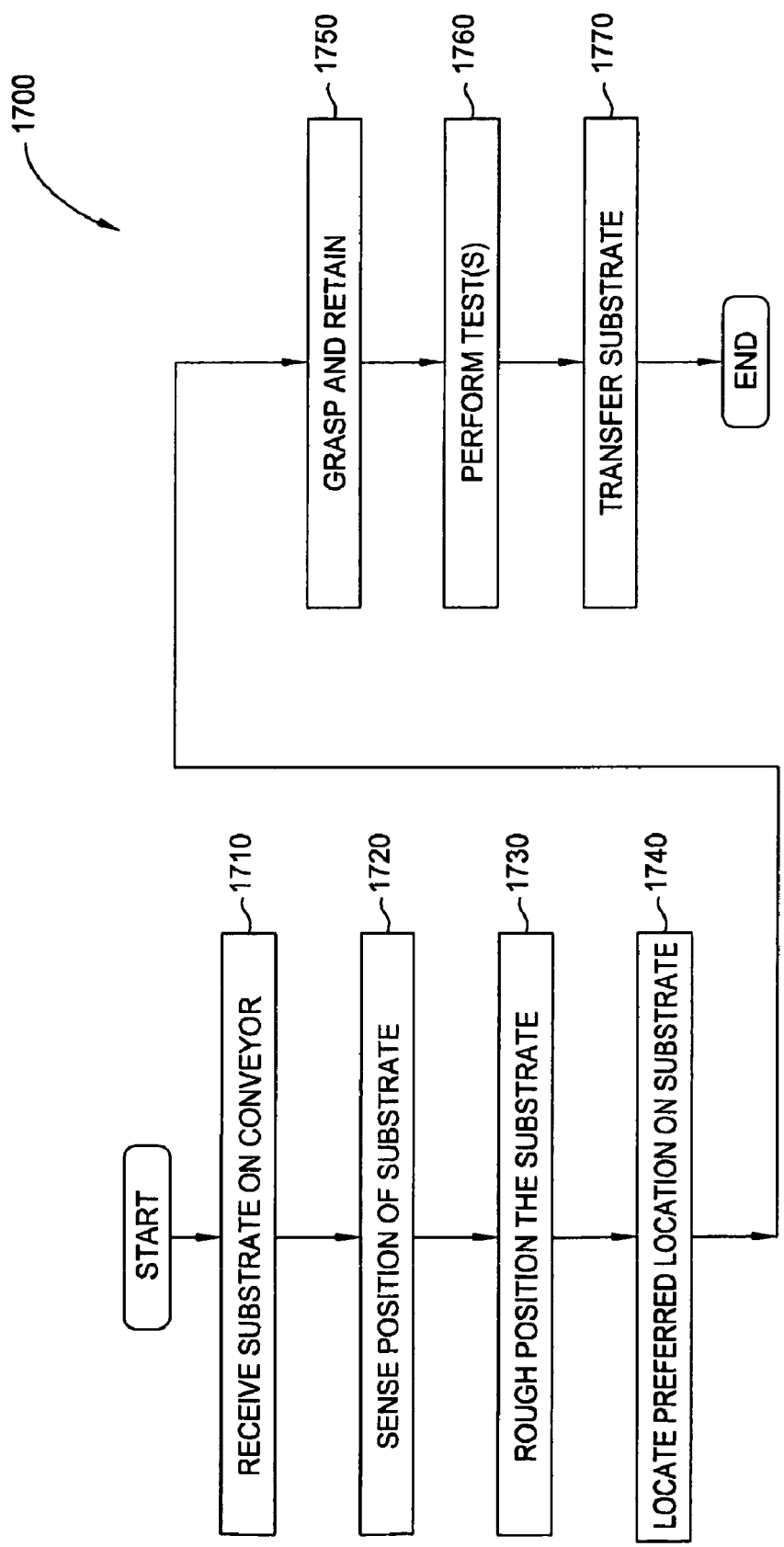
FIG. 17 illustrates a process sequence for using a solar parametric testing module according to one embodiment described herein.

Referring to FIGS. 1A-1B, 16A, 16B and 17, in one or all of the steps 111, 123, or 127, a series of sub-sequence steps, or processing sequence 1700, is used to complete the solar parametric testing process. FIG. 17 illustrates one embodiment of the process sequence 1700 that includes a plurality of steps (i.e., steps 1710-1770) that are used to test aspects of the solar cell formation processing sequence 100A or 100B. The configuration of the processing sequence, number of processing steps, and order of the processing steps in the process sequence 1700 illustrated herein are not intended to be limiting to the scope of the invention.

The process sequence 1700 generally begins at step 1710 in which one or more device substrates 303 are moved to the input of the SPT module 1600 by use of a robotic device so that the automated conveyor rollers 1621A can receive and position the device substrate 303. In one embodiment, the automated conveyor rollers 1621 are adapted to receive a plurality of device substrates 303 that have been processed following one or more of the steps 102-130 in the processing sequence 100A or 100B. In one embodiment, movement of the device substrates 303 are controlled by commands sent to one or more driving mechanisms coupled to the automated conveyor rollers 1621 from the system controller 290.

In step 1720, the device substrate 304 may be moved along the automated conveyor rollers 1621 until the leading edge of the device substrate 304 is sensed by a moveable hard stop element and an optical sensor or a position sensor contained in the leading edge rough stop 1623A. The leading edge is generally the edge of the device substrate 303 that is perpendicular to the direction of motion "A" and is first to advance into range of the leading edge rough stop 1623 A (FIGS. 16A and 16B).

In step 1730, the device substrate 303 may be lowered onto a gas cushion created by the gas flowing through the plurality of holes formed in the plurality of frictionless support elements 1622. In one embodiment, the device substrate 303 is lowered onto the gas cushion by use of one or more actuators that raise and lower the automated conveyor rollers 1621A. Once the device substrate 303 is positioned on the gas cushion, it may then be aligned to the Y-axis datum elements 1624A by use of the pusher elements 1624B. In one embodiment servo motors in the Y-axis datum elements 1624A and the pusher elements 1624B are controlled to position the device substrate 303 in a desired location within the SPT module 1600.

Next, a size appropriate trailing edge rough stop 1623B may be raised to engage the trailing edge of the device substrate 303. In one embodiment, the trailing edge rough stop 1623B urges the device substrate 303 against the leading edge rough stop 1623A. In one embodiment, servo control of the Y-axis datum elements 1624A, the trailing edge rough stop 1623B, and the leading edge rough stop 1623A allows the device substrate 303 to be positioned in the X and Y directions such that fine adjustments or corrections cam be made in subsequent steps.

In step 1740, an accurate location and alignment may be attained between features formed on the device substrate 303 and the automated components in the SPT module 1600. In one embodiment, the X-direction, Y-direction, and angular alignment of the scribed trenches 381C (FIG. 3C) are aligned relative to the automation components in the SPT module 1600. The X-direction, Y-direction, and angular alignment of the device substrate 303 can be adjusted by use of the data collected by the vision system 1640 and control signals sent to the servo controlled Y-axis datum elements 1624A, trailing edge rough stop 1623B, and the leading edge rough stop 1623A by the system controller 290.

In step 1750, once the device substrate has been aligned, the device substrate 303 may then be grasped and retained by the gripping members 1623C. In one embodiment, once the gripping members 1623C have grasped a portion of the device substrate 303, the Y-axis datum elements 1624A, the trailing edge rough stop 1623B, and the leading edge rough stop 1623B are disengaged from the device substrate 303 and are retracted. In one embodiment, the one or more gripping members 1623C are generally adapted to grasp one or more non-active regions of the device substrate 303, such as the region at the edge of the device substrate 303 cleared by the seamer/edge deletion module 226 during step 126.

In one embodiment, the gripping members 1623C are used to move the device substrate 303 along a known path through the SPT module 1600. In one embodiment, moving of the gripping members 1623C is controlled by commands received from the system controller 290. In one embodiment, the vision system 1640 is used to recheck the position of the device substrate 303 after the gripping members 1623C have grasped a portion of the substrate to assure that the device substrate 303 is still in a desirable alignment.

In step 1760, the one or more of the test structures 400-1100 in one or more of the test dice 1202 are probed and analyzed by use of the resistance measurement module 1660, solar cell efficiency module 1650, and/or the light source 1670.

In step 1770, after the operations in step 1760 have been completed on a desired number of test dice 1202 on the device substrate 303, the gripping members 1623C then release the device substrate 303 and the automated conveyor rollers 1621A are raised to receive the device substrate 303 from the frictionless support elements 1622. After the device substrate 303 has been received by the automated conveyor rollers 1621A the gas flowing to the frictionless support elements 1622 is turned off and the automated conveyor rollers 1621A move the device substrate 303 out of the SPT module 1600. Movement of the device substrate 303 can be controlled by commands sent to one or more driving mechanism coupled to the automated conveyor rollers 1621A from the system controller 290.

While the foregoing is directed to embodiments of the present invention, other and further embodiments of the invention may be devised without departing from the basic scope thereof, and the scope thereof is determined by the claims that follow.

The invention claimed is:

1. A solar parametric testing module, comprising:
   an automation system having a conveyor configured to receive a solar cell substrate having one or more test structures formed thereon into the solar parametric testing module and transfer the solar cell substrate out of the solar parametric testing module, wherein the automation system further comprises:
      a plurality of frictionless support elements positioned adjacent the conveyor;
      a leading edge rough stop configured to position the leading edge of the solar cell substrate as it is advanced within the solar parametric testing module;
      a trailing edge rough stop configured to position the trailing edge of the solar cell substrate as it is advanced within the solar parametric testing module;
      a datum element configured to position a side edge of the solar cell substrate:
      a pusher element configured to urge the solar cell substrate against the datum element; and
      a gripping member configured to grasp and retain the solar cell substrate;
   a vision system having one or more cameras, wherein the vision system is configured to scan the solar cell substrate and send signals regarding the position of one or more features on the solar cell substrate to a system controller, and wherein the automation system is further configured to receive commands from the system controller and position the solar cell substrate based on the signals sent by the vision system; and
   a measurement module configured to supply a voltage to a plurality of points on the one or more test structures and measure the resistance between the points.

2. The module of claim 1, wherein the measurement module comprises:
   a plurality of probe pins;
   a voltage source electrically coupled to at least two of the probe pins; and
   a voltage measurement device electrically coupled to at least two of the probe pins.

3. The module of claim 2, wherein the frictionless support elements comprise a gas receiving plenum having one or more plenum surfaces with a plurality of holes formed therein and a gas flowing therethrough.

4. The module of claim 3, wherein the gripping member is configured to receive commands from the system controller for positioning the solar cell substrate based on the signals sent by the vision system.

5. The module of claim 4, wherein at least one of the one or more test structures comprises a glass substrate having a front contact layer, an absorber layer, and a back contact layer deposited thereon, wherein the test structure is isolated from the remainder of the solar cell substrate via isolation trenches formed through the front contact layer, the absorber layer, and the back contact layer.

6. The module of claim 4, wherein at least one of the one or more test structures comprises a glass substrate having a front contact layer, an absorber layer, and a back contact layer deposited thereon, wherein the back contact layer is in direct contact with the front contact layer in contact regions of the test structure, and wherein the test structure is isolated from the remainder of the solar cell substrate via isolation trenches formed through the absorber layer and the back contact layer.

7. The module of claim 6, wherein the absorber layer is in direct contact with the glass substrate in an active region of the test structure.

8. A solar parametric testing module, comprising:
   an automation system having a conveyor configured to receive a solar cell substrate having one or more test structures formed thereon into the solar parametric testing module and transfer the solar cell substrate out of the solar parametric testing module, wherein the automation system further comprises:
      a plurality of frictionless support elements positioned adjacent the conveyor;
      a leading edge rough stop configured to position the leading edge of the solar cell substrate as it is advanced within the solar parametric testing module;
      a trailing edge rough stop configured to position the trailing edge of the solar cell substrate as it is advanced within the solar parametric testing module;
      a datum element configured to position a side edge of the solar cell substrate;
      a pusher element configured to urge the solar cell substrate against the datum element; and
      a gripping member configured to grasp and retain the solar cell substrate;
   a vision system having one or more cameras, wherein the vision system is configured to scan the solar cell substrate and send signals regarding the position of one or more features on the solar cell substrate to a system controller, and wherein the automation system is further configured to receive commands from the system controller and position the solar cell substrate based on the signals sent by the vision system;
   a measurement module configured to supply a voltage to a plurality of points on the one or more test structures and measure the resistance between the points;
   a light source configured to project a controlled amount of light toward a surface of the one or more test structures on a side opposite the measurement module; and
   an efficiency module coupled to the resistance measurement module and the light source and configured to characterize the performance of the one or more test structures via the light source and the measurement module.

9. The module of claim 8, wherein the measurement module comprises:
   a plurality of probe pins;
   a voltage source electrically coupled to at least two of the probe pins;
   a current source electrically coupled to at least two of the probe pins;
   a voltage measurement device electrically coupled to at least two of the probe pins; and
   a current measurement device connected to at least one of the probe pins.

10. The module of claim 9, wherein the frictionless support elements comprise a gas receiving plenum having one or more plenum surfaces with a plurality of holes formed therein and a gas flowing therethrough.

11. The module of claim 10, wherein the gripping member is configured to receive commands from the system controller for positioning the solar cell substrate based on the signals sent by the vision system.

12. The module of claim 11, wherein at least one of the one or more test structures comprises a front contact layer having a series of scribe lines formed therein, an absorber layer deposited over the front contact layer and having a series of scribe lines formed therein, and a back contact layer deposited over the absorber layer and having a series of scribe lines formed therein.

13. The module of claim 11, wherein at least one of the one or more test structures comprises a glass substrate having a front contact layer deposited thereover, an absorber layer deposited over the front contact layer, and a back contact layer deposited over the absorber layer, wherein the test structure is isolated from the remainder of the solar cell substrate via isolation trenches formed through the front contact layer, the absorber layer, and the back contact layer.

14. The module of claim 11, wherein at least one of the one or more test structures comprises a glass substrate having a front contact layer deposited thereover, an absorber layer deposited over the front contact layer, and a back contact layer deposited over the absorber layer, wherein the back contact layer is in direct contact with the front contact layer in contact regions of the test structure, and wherein the test structure is isolated from the remainder of the solar cell substrate via isolation trenches formed through the absorber layer and the back contact layer.

15. The module of claim 14, wherein the absorber layer is in direct contact with the glass substrate in an active region of the test structure.

* * * * *